US011592690B2

(12) United States Patent
Wang et al.

(10) Patent No.: US 11,592,690 B2
(45) Date of Patent: Feb. 28, 2023

(54) LOUDSPEAKER DEVICE

(71) Applicant: SHENZHEN SHOKZ CO., LTD., Guangdong (CN)

(72) Inventors: Yueqiang Wang, Shenzhen (CN); Haofeng Zhang, Shenzhen (CN); Yongjian Li, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 95 days.

(21) Appl. No.: 17/172,092

(22) Filed: Feb. 10, 2021

(65) Prior Publication Data
US 2021/0168482 A1 Jun. 3, 2021

Related U.S. Application Data

(63) Continuation of application No. PCT/CN2019/102398, filed on Aug. 24, 2019.

(30) Foreign Application Priority Data

Aug. 24, 2018 (CN) .......................... 201810975515.1
Jan. 5, 2019 (CN) .......................... 201910009904.3
Jan. 5, 2019 (CN) .......................... 201920031804.6

(51) Int. Cl.
H04R 1/02 (2006.01)
G02C 11/00 (2006.01)
(Continued)

(52) U.S. Cl.
CPC ................ *G02C 11/10* (2013.01); *G02C 5/14* (2013.01); *G02C 5/22* (2013.01); *G02C 5/2254* (2013.01);
(Continued)

(58) Field of Classification Search
CPC ...... H04R 2460/13; H04R 9/06; H04R 11/02; H04R 2400/03; H04R 1/1075;
(Continued)

(56) References Cited

U.S. PATENT DOCUMENTS 4,902,120 A 2/1990 Weyer
7,289,767 B2 10/2007 Lai
(Continued)

FOREIGN PATENT DOCUMENTS

CN 2639920 Y 9/2004
CN 102141688 A 8/2011
(Continued)

OTHER PUBLICATIONS

International Search Report in PCT/CN2019/102394 dated Nov. 28, 2019, 8 pages.
(Continued)

*Primary Examiner* — Norman Yu
(74) *Attorney, Agent, or Firm* — Metis IP LLC

(57) ABSTRACT

The present disclosure provides a loudspeaker device. The loudspeaker device may include an earphone core configured to transfer an electrical signal to a vibration signal; an auxiliary function module configured to receive an auxiliary signal and perform an auxiliary function; a first flexible circuit board configured to electrically connect to an audio signal wire and an auxiliary signal wire of an external control circuit, the audio signal wire and the auxiliary signal wire being electrically connected with the earphone core and the auxiliary function module, respectively through the first flexible circuit board; and a core housing configured to accommodate the earphone core, the auxiliary function module, and the first flexible circuit board. The wiring process inside the loudspeaker device provided in the pres-
(Continued)

ent disclosure may be simplified, thereby further reducing a volume of the loudspeaker device.

20 Claims, 13 Drawing Sheets

(51) Int. Cl.
    *G02C 5/22*     (2006.01)
    *H04R 1/10*     (2006.01)
    *H04R 9/06*     (2006.01)
    *H04R 1/06*     (2006.01)
    *H04R 9/02*     (2006.01)
    *G02C 5/14*     (2006.01)
    *G02C 11/06*     (2006.01)
    *H04R 1/28*     (2006.01)
    *H05K 1/02*     (2006.01)
    *H04R 25/00*     (2006.01)
    *H04R 1/04*     (2006.01)
    *H05K 1/18*     (2006.01)

(52) U.S. Cl.
    CPC ............... *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(58) Field of Classification Search
    CPC ........ H04R 2225/021; H04R 2225/023; H04R 2225/67; H04R 2420/07; H04R 2499/11; H04R 25/48; H04R 9/063; H04R 1/00; H04R 1/10; H04R 9/02; H04R 9/025; H04R 9/066; H04R 31/00; H04R 25/606; G02C 11/10; G02C 5/14; G02C 5/22; G02C 5/2254; G02C 11/06; H05K 1/028; H05K 1/189; H05K 2201/05
    USPC ......... 381/151, 380, 162, 182, 326; 340/7.6; 600/25
    See application file for complete search history.

(56) References Cited

U.S. PATENT DOCUMENTS

| | | | |
|---|---|---|---|
| 9,674,597 B1 * | 6/2017 | O'Connell | H04R 5/033 |
| 2008/0013041 A1 | 1/2008 | Chou | |
| 2008/0164934 A1 * | 7/2008 | Hankey | H01R 13/2428 439/39 |
| 2008/0240486 A1 * | 10/2008 | Garcia | H04R 1/1075 381/380 |
| 2008/0260188 A1 * | 10/2008 | Kim | H04R 7/02 181/167 |
| 2011/0200204 A1 | 8/2011 | Horigome et al. | |
| 2014/0253867 A1 | 9/2014 | Jiang et al. | |
| 2015/0257662 A1 | 9/2015 | Lee et al. | |
| 2016/0234613 A1 | 8/2016 | Westerkull | |
| 2016/0246076 A1 | 8/2016 | Wei | |
| 2016/0286302 A1 * | 9/2016 | Huang | H04R 1/1008 |
| 2017/0090201 A1 | 3/2017 | Guo | |
| 2020/0336824 A1 | 10/2020 | Zheng et al. | |
| 2020/0344542 A1 | 10/2020 | Liu et al. | |

FOREIGN PATENT DOCUMENTS

| | | |
|---|---|---|
| CN | 201984240 U | 9/2011 |
| CN | 202364340 U | 8/2012 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205961389 U | 2/2017 |
| CN | 206061075 U | 3/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206640748 U | 11/2017 |
| CN | 206920741 U | 1/2018 |
| CN | 107948881 A | 4/2018 |
| CN | 207424414 U | 5/2018 |
| CN | 207443120 U | 6/2018 |
| CN | 108391188 A | 8/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| JP | S59161928 A | 9/1984 |
| JP | 2006157318 A | 6/2006 |
| WO | 9623373 A1 | 8/1996 |
| WO | 2006023341 A2 | 3/2006 |
| WO | 2007070508 A2 | 6/2007 |
| WO | 2007133055 A1 | 11/2007 |
| WO | 2015115693 A1 | 8/2015 |

OTHER PUBLICATIONS

International Search Report in PCT/CN2019/102377 dated Dec. 3, 2019, 8 pages.
International Search Report in PCT/CN2019/102378 dated Nov. 6, 2019, 7 pages.
International Search Report in PCT/CN2019/102385 dated Nov. 18, 2019, 6 pages.
International Search Report in PCT/CN2019/102389 dated Nov. 28, 2019, 8 pages.
International Search Report in PCT/CN2019/102396 dated Nov. 27, 2019, 8 pages.
International Search Report in PCT/CN2019/102395 dated Nov. 27, 2019, 9 pages.
International Search Report in PCT/CN2019/102406 dated Nov. 26, 2019, 7 pages.
International Search Report in PCT/CN2019/102407 dated Nov. 8, 2019, 6 pages.
International Search Report in PCT/CN2019/102408 dated Nov. 6, 2019, 6 pages.
International Search Report in PCT/CN2019/102398 dated Oct. 31, 2019, 6 pages.
International Search Report in PCT/CN2019/102386 dated Nov. 25, 2019, 7 pages.

(56) References Cited

OTHER PUBLICATIONS

International Search Report in PCT/CN2019/102390 dated Nov. 22, 2019, 8 pages.
International Search Report in PCT/CN2019/102391 dated Nov. 22, 2019, 8 pages.
Written Opinion in PCT/CN2019/102391 dated Nov. 22, 2019, 12 pages.
Written Opinion in PCT/CN2019/102390 dated Nov. 22, 2019, 10 pages.
Written Opinion in PCT/CN2019/102396 dated Nov. 27, 2019, 10 pages.
Written Opinion in PCT/CN2019/102377 dated Dec. 3, 2019, 9 pages.
Written Opinion in PCT/CN2019/102378 dated Nov. 6, 2019, 13 pages.
Written Opinion in PCT/CN2019/102385 dated Nov. 18, 2019, 11 pages.
Written Opinion in PCT/CN2019/102389 dated Nov. 28, 2019, 9 pages.
Written Opinion in PCT/CN2019/102395 dated Nov. 27, 2019, 10 pages.
Written Opinion in PCT/CN2019/102394 dated Nov. 28, 2019, 9 pages.
Written Opinion in PCT/CN2019/102406 dated Nov. 26, 2019, 12 pages.
Written Opinion in PCT/CN2019/102407 dated Nov. 8, 2019, 10 pages.
Written Opinion in PCT/CN2019/102408 dated Nov. 6, 2019, 12 pages.
Written Opinion in PCT/CN2019/102398 dated Oct. 31, 2019, 9 pages.
Written Opinion in PCT/CN2019/102386 dated Nov. 25, 2019, 12 pages.

\* cited by examiner

LOUDSPEAKER DEVICE

CROSS-REFERENCE TO RELATED APPLICATIONS

This application is a continuation of International Application No. PCT/CN2019/102398, filed on Aug. 24, 2019, which claims priority of Chinese Patent Application No. 201810975515.1, field on Aug. 24, 2018, Chinese Patent Application No. 201910009904.3, filed on Jan. 5, 2019, and Chinese Patent Application No. 201920031804.6, filed on Jan. 5, 2019, the entire contents of each of which are hereby incorporated by reference.

TECHNICAL FIELD

The disclosure generally relates to the field of loudspeaker devices and more particularly relates to an adaptation and wiring process of a flexible printed circuit (FPC) of a loudspeaker device.

BACKGROUND

With the development of speaker technology, electronic products (e.g., earphones, MP3, etc.) have been widely used. Speakers may have different product forms. For example, a speaker may be integrated on the eyeglasses (e.g., sunglasses, swimming eyeglasses, etc.) or fixed inside an ear or near the ear of a user through a special structure (e.g., an ear hook). As the functions of the products become more diverse, there may be more and more internal modules and wiring of the speaker, and the wiring may be more and more complicated. The complicated wiring may greatly occupy an internal space of the product, and an unreasonable wiring distribution may cause wires to affect each other, which may cause an abnormal sound and affect the sound quality of the speaker. Therefore, it may be necessary to provide a more efficient wiring technology, to simplify a wiring approach of the speaker and improve the sound quality of the speaker.

SUMMARY

The present disclosure provides a loudspeaker device. The loudspeaker device may include an earphone core, an auxiliary function module, a first flexible circuit board, and a core housing. The earphone core may be configured to transfer an electrical signal to a vibration signal. The auxiliary function module may be configured to receive an auxiliary signal and perform an auxiliary function. The first flexible circuit board may be configured to electrically connect to an audio signal wire and an auxiliary signal wire of an external control circuit. The audio signal wire and the auxiliary signal wire may be electrically connected with the earphone core and the auxiliary function module, respectively through the first flexible circuit board. The core housing may be configured to accommodate the earphone core, the auxiliary function module, and the first flexible circuit board.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
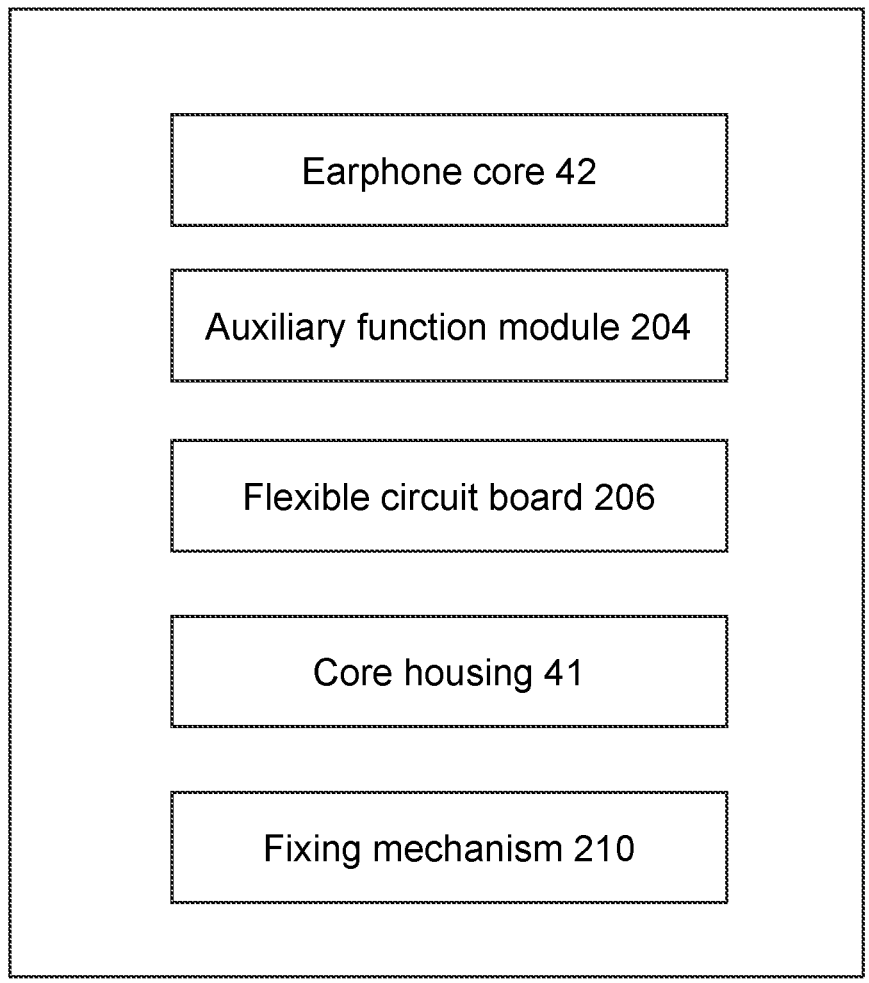
FIG. 1 is a block diagram illustrating an exemplary loudspeaker device according to some embodiments of the present disclosure.

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "loudspeaker device" or "speaker" may be used when illustrating related technologies of conduction in the present disclosure. The illustration is only a form of conductive application. For those skilled in the art, "loudspeaker device" or "speaker" may also be replaced with other similar words, such as "sound producing device," "hearing aid," "sound raising device," or the like. In fact, various implementations in the present disclosure may be easily applied to other hearing devices belonging to a non-speaker component. For example, for those skilled in the art, after understanding the basic principles of loudspeaker device, it may be possible to make various modifications and changes in the form and details of the specific methods and operations of implementing loudspeaker device without departing from the principles. In particular, an environmental sound collection and processing function may be added to the loudspeaker device to enable the loudspeaker device to implement the function of a hearing aid. For example, a microphone may collect environmental sounds of a user/wearer, process the sounds using a certain algorithm and transmit the processed sound (or generated electrical signal) to a speaker. That is, the loudspeaker device may be modified to include the function of collecting the environmental sounds, and after a certain signal processing, the sound may be transmitted to the user/wearer via the speaker module, so as to realize the functions of speakers and traditional speaker devices at the same time. As an example, the algorithm mentioned herein may include noise cancellation, automatic gain control, acoustic feedback suppression, wide dynamic range compression, active environment recognition, active noise reduction, directional processing, tinnitus processing, multichannel wide dynamic range compression, active howling suppression, volume control, or the like, or any combination thereof.

FIG. 1 is a block diagram illustrating an exemplary loudspeaker device according to some embodiments of the present disclosure. According to FIG. 1, in some embodiments, a speaker may include at least an earphone core 42, an auxiliary function module 204, a flexible circuit board 206, a core housing 41, and a fixing mechanism 210.

In some embodiments, the earphone core 42 may receive electrical audio signal(s) and convert the audio signal(s) into the sound signal(s). The flexible circuit board 206 may include a first flexible circuit board and a second flexible circuit board. The flexible circuit board 206 may facilitate electrical connection(s) between different modules/components. For example, the first flexible circuit board may facilitate an electrical connection between the earphone core 42 and an external control circuit and an electrical connection between the earphone core 42 and the auxiliary function module 204. For instance, the first flexible circuit board may be used to connect with the earphone core and the auxiliary function module, and the second flexible circuit board may be used to connect a battery to other components. In some embodiments, the core housing 41 may be configured to accommodate the earphone core 42, the auxiliary function module 204, and the flexible circuit board 206. Further, the fixing mechanism 210 may be connected to the core housing 41, and be configured to support and maintain the position of the core housing 41. In some embodiments, the speaker may transmit sound(s) through a bone conduction mode or an air conduction mode.

Specifically, when the speaker transmits a sound through the bone conduction mode, an outer surface of the core housing 41 may have a fitting surface. The fitting surface may be an outer surface of the speaker in contact with the human body when the user wears the speaker. The speaker may compress the fitting surface against a preset area (e.g., a front end of a tragus, a position of a skull, or a back surface of an auricle), thereby effectively transmitting the vibration signal(s) to the auditory nerve of the user through the bone and improving the sound quality of the speaker. In some embodiments, the fitting surface may be abutted on the back surface of the auricle. The mechanical vibration signal(s) may be transmitted from the earphone core 42 to the core housing 41 and transmitted to the back of the auricle through the fitting surface of the core housing 41. The vibration signal(s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the speaker.

Figure 2:
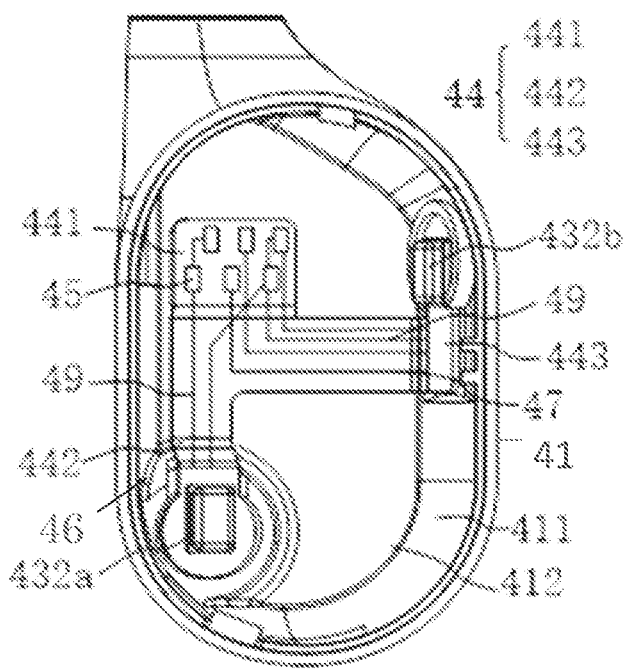
FIG. 2 is a schematic structural diagram illustrating an exemplary flexible circuit board located inside a core housing according to some embodiments of the present disclosure.
Figure 3:
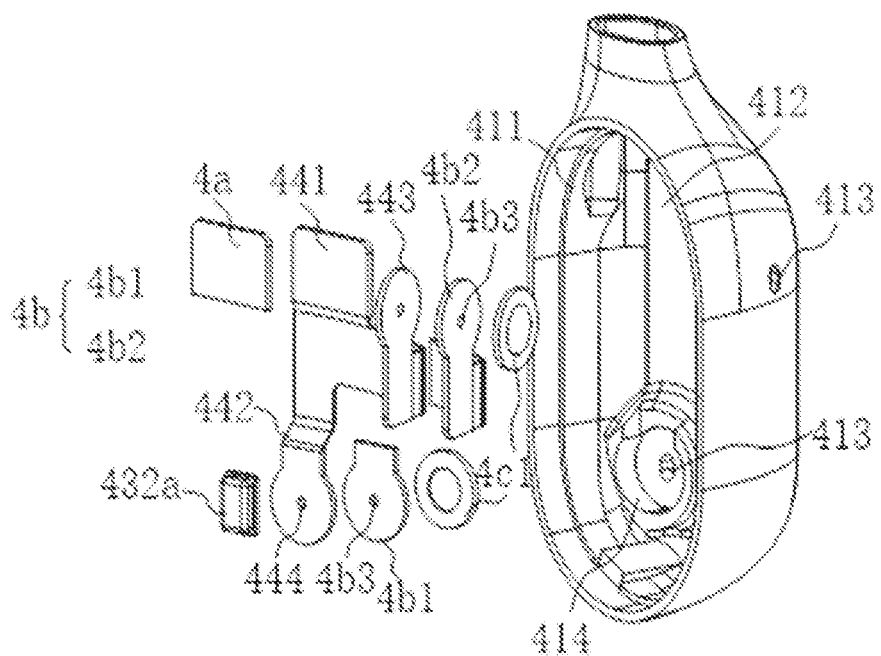
FIG. 3 is an exploded diagram illustrating a partial structure of a speaker according to some embodiments of the present disclosure.

FIG. 2 is a schematic structural diagram illustrating an exemplary flexible circuit board located inside a core housing according to some embodiments of the present disclosure. FIG. 3 is an exploded diagram illustrating a partial structure of a speaker according to some embodiments of the present disclosure. According to FIGS. 2 and 3, in some embodiments, the first flexible circuit board 44 may be disposed with a plurality of pads. Different signal wires (e.g., audio signal wires, auxiliary signal wires) may be electrically connected to different pads through different flexible leads to avoid numerous and complicated internal wires issues, which may occur when both audio signal wires and auxiliary signal wires need to be connected to the earphone core 42 or the auxiliary function module.

As shown in FIGS. 2 and 3, in some embodiments, the first flexible circuit board 44 may at least include a plurality of first pads 45 and a plurality of second pads 46. At least one of the first pads 45 may be electrically connected to auxiliary function module(s). The at least one of the first pads 45 may be electrically connected to at least one of the second pads 46 through a first flexible lead 47 on the first flexible circuit board 44. The at least one of the second pads 46 may be electrically connected to the earphone core 42 through external wire(s) 4. At least another one of the first pads 45 may be electrically connected to auxiliary signal wire(s). The at least another one of the first pads 45 and the auxiliary function module(s) may be electrically connected through a second flexible lead 49 on the first flexible circuit board 44.

In some embodiments, the at least one of the first pads 45 may be electrically connected to the auxiliary function module(s) 204. The at least one of the second pads 46 may be electrically connected to the earphone core 42 through the external wire(s). The one of the at least one of the first pads 45 may be electrically connected to one of the at least one of the second pads 46 through the first flexible lead 47, so that the external audio signal wire(s) and the auxiliary signal wire(s) may be electrically connected to the earphone core 42 and the auxiliary function modules 204 at the same time through the first flexible circuit board 44, which may simplify a layout of the wiring.

In some embodiments, the audio signal wire(s) may be wire(s) electrically connected to the earphone core 42 and transmitting audio signal(s) to the earphone core 42. The auxiliary signal wire(s) may be wire(s) electrically connected to the auxiliary function modules 204 and performing signal transmission with the auxiliary function modules 204.

In some embodiments, according to FIG. 2, specifically, the first flexible circuit board 44 may be disposed with the plurality of first pads 45 and two second pads 46. The two second pads 46 and at least one of the plurality of first pads 45 may be located on the same side of the first flexible circuit board 44 and spaced apart. The two second pads 46 may be connected to two corresponding first pads 45 of the plurality of first pads 45 through the first flexible lead(s) 47 on the first flexible circuit board 44. Further, a core housing 41 may also accommodate two external wires. One end of each of the external wires may be welded to a corresponding second pad 46, and the other end may be connected to the earphone core 42, so that the earphone core 42 may be connected to the second pads 46 through the external wires. The auxiliary function module may be mounted on the first flexible circuit board 44 and connected to other pads of the plurality of first pads 45 through the second flexible lead(s) 49 on the first flexible circuit board 44.

In some embodiments, wires may be disposed in the fixing mechanism 210 of the speaker. The wires may at least include the audio signal wire(s) and the auxiliary signal wire(s). In some embodiments, there may be multiple wires in the fixing mechanism 210. Such wires may include at least two audio signal wires and at least two auxiliary signal wires. For example, the fixing mechanism 210 may include an ear hook. The ear hook may be connected to the core housing 41, and the wires may be ear hook wires disposed in the ear hook. One end of each of the ear hook wires is welded to the first flexible circuit board 44 arranged in the core housing 41, or to a control circuit board, and the other end enters the core housing 41 and is welded to the first pads 45 of the first flexible circuit board 44.

Further, the fixing mechanism 210 may further include a circuit housing 10, an ear hook 20, a rear hook 30, or the like.

As used herein, one end of each of the two audio signal wires in the ear hook wires, which is located in the core housing 41, may be welded to the two first pads 45 by two first flexible leads 47, and the other end may be directly or indirectly connected to the control circuit board. The two first pads 45 may be further connected to the earphone core 42 through the welding of the second flexible lead(s) 49 and the two second pad 46 and the welding of the two external wires and the second pads 46, thereby transmitting the audio signal(s) to the earphone core 42.

One end of each of at least two auxiliary signal wires in the core housing 41 may be welded to the first pad 45 by the second flexible lead(s) 49, and the other end may be directly or indirectly connected to the control circuit board so as to pass the auxiliary signal(s) received and transformed by the auxiliary function module(s) to the control circuit 51.

In the approach described above, the first flexible circuit board 44 may be disposed in the core housing 41, and the corresponding pads may be further disposed on the first flexible circuit board 44. Therefore, the wires 23 may enter the core housing 41 and be welded to the corresponding pads, and further connected to the corresponding auxiliary function module(s) 204 through the first flexible leads 47 and the second flexible leads 49 on the pads, thereby avoiding a plurality of wires directly connected to the auxiliary function module(s) 204 to make the wiring in the core housing 41 complicated. Therefore, the arrangement of the wirings may be optimized, and the space occupied by the core housing 41 may be saved. In addition, when the multiple ear hook wires are directly connected to the auxiliary function module(s) 204, a middle portion of each of the ear hook wires may be suspended in the core housing 41 to easily cause vibration, thereby resulting in abnormal sounds to affect the sound quality of the earphone core 42. According to the approach, the ear hook wires may be welded to the first flexible circuit board 44 and further connected to the corresponding auxiliary function module(s), which may reduce a situation that the wires are suspended from affecting the quality of the earphone core 42, thereby improving the sound quality of the earphone core 42 to a certain extent.

In some embodiments, the first flexible circuit board 44 may be further divided. The first flexible circuit board 44 may be divided into at least two regions. One auxiliary function module 204 may be disposed on one of the at least two regions, so that at least two auxiliary function modules 204 may be disposed on the first flexible circuit board 44. Wiring between the audio signal wire(s) and the auxiliary signal wire(s) and the at least two auxiliary function modules may be implemented through the first flexible circuit board 44.

In some embodiments, the first flexible circuit board 44 may include at least a main circuit board 441 and a first branch circuit board 442. The first branch circuit board 442 may be connected to the main circuit board 441 and extend away from the main circuit board 441 along one end of the main circuit board 441. The auxiliary function module 204 may include a first auxiliary function module and a second auxiliary function module. The first auxiliary function module may be disposed on the main circuit board 441, and the second auxiliary function module may be disposed on the first branch circuit board 442.

Further, the plurality of first pads 45 may be disposed on the main circuit board 441, and the second pads 46 may be disposed on the first branch circuit board 442. In some embodiments, the first auxiliary function module may be a key switch 431. The key switch 431 may be disposed on the main circuit board 441, and the first pads 45 may be disposed corresponding to the key switch 431. The second auxiliary function module may be a microphone. The microphone may be disposed on the first branch circuit board 442, and the second pads 46 corresponding to the microphone may be disposed on the first branch circuit board 442. The first pads 45 corresponding to the key switch 431 on the main circuit board 441 may be connected to the second pads 46 corresponding to the microphone on the first branch circuit board 442 through the second flexible lead(s) 49. The key switch 431 may be electrically connected to the microphone 432, so that the key switch 431 may control or operate the microphone 432.

In some embodiments, the first flexible circuit board 44 may further include a second branch circuit board 443. The second branch circuit board 443 may be connected to the main circuit board 441. The second branch circuit board 443 may extend away from the main circuit board 441 along the other end of the main circuit board 441 and be spaced from the first branch circuit board 442.

Further, the plurality of first pads 45 may be disposed on the main circuit board 441. At least one of the second pads 46 may be disposed on the first branch circuit board 442, and the other second pads 46 may be disposed on the second branch circuit.

Further, the auxiliary function module 204 may include a third auxiliary function module. The third auxiliary function module may be disposed on the second branch circuit board 443.

In some embodiments, the third auxiliary function module may be a second microphone element 432b. The second branch circuit board may extend perpendicular to the main circuit board 441. The second microphone element 432b may be mounted on the end of the second branch circuit board 443 away from the main circuit board 441. Multiple pads may be disposed at the end of the main circuit board 441 away from the second branch circuit board 443.

As shown in FIG. 2 and FIG. 3, the second auxiliary function module may be the first microphone element 432a. The third auxiliary function module may be the second microphone element 432b. As used herein, the first microphone element 432a and the second microphone element 432b may both be MEMS (micro-electromechanical system) microphone 432, which may have a small working current, relatively stable performance, and high voice quality. The two microphones 432 may be disposed at different positions of the first flexible circuit board 44 according to actual needs.

As used herein, the first flexible circuit board 44 may include a main circuit board 441, and a first branch circuit board 442 and a second branch circuit board 443 connected to the main circuit board 441. The first branch circuit board 442 may extend in the same direction as the main circuit board 441. The first microphone element 432a may be mounted on one end of the first branch circuit board 442 away from the main circuit board 441. The second branch circuit board 443 may extend perpendicular to the main circuit board 441. The second microphone element 432b may be mounted on one end of the second branch circuit board 443 away from the main circuit board 441. A plurality of first pads 45 may be disposed on the end of the main circuit board 441 away from the first branch circuit board 442 and the second branch circuit board 443.

In some embodiments, the core housing 41 may include a peripheral side wall 411 arranged around and a bottom end wall 412 connected to one end surface of the peripheral side wall 411, so as to form an accommodation space with an open end. As used herein, an earphone core 42 may be disposed in the accommodation space through the open end. The first microphone element 432a may be fixed on the bottom end wall 412. The second microphone element 432b may be fixed on the peripheral side wall 411.

In some embodiments, the first branch circuit board 442 and/or the second branch circuit board 443 may be appropriately bent to suit a position of a sound inlet corresponding to the microphone 432 on the core housing 41. Specifically, the first flexible circuit board 44 may be disposed in the core housing 41 in a manner that the main circuit board 441 is parallel to the bottom end wall 412. Therefore, the first microphone element 432a may correspond to the bottom end wall 412 without bending the main circuit board 441. Since the second microphone element 432b may be fixed on the peripheral side wall 411 of the core housing 41, it may be necessary to bend the second main circuit board 441. Specifically, the second branch circuit board 443 may be bent at one end away from the main circuit board 441 so that a board surface of the second branch circuit board 443 may be perpendicular to a board surface of the main circuit board 441 and the first branch circuit board 442. Further, the second microphone element 432b may be fixed at the peripheral side wall 411 of the core housing 41 in a direction facing away from the main circuit board 441 and the first branch circuit board 442.

In some embodiments, the first pads 45, the second pads 46, the first microphone element 432a, and the second microphone element 432b may be disposed on the same side of the first flexible circuit board 44. The second pads 46 may be disposed adjacent to the second microphone element 432b.

As used herein, the second pads 46 may be specifically disposed at one end of the branch circuit board 443 away from the main circuit board 441 and have the same direction as the second microphone element 432b and disposed at intervals. Therefore, the second pads may be perpendicular to the direction of the first pads 45 as the branch circuit board 443 is bent. It should be noted that the second branch circuit board 443 may not be perpendicular to the board surface of the main circuit board 441 after being bent, which may be determined according to the arrangement between the side wall 411 and the bottom end wall 412.

Further, another side of the first flexible circuit board 44 may be disposed with a rigid support plate 4a and a microphone rigid support plate 4b for supporting the first pads 45. The microphone rigid support plate 4b may include a rigid support plate 4b1 for supporting the first microphone element 432a and a rigid support plate 4b2 for supporting the second pads and the second microphone element 432b together.

As used herein, the rigid support plate 4a, the rigid support plate 4b1, and the rigid support plate 4b2 may be mainly used to support the corresponding pads and the microphone 432, and thus may need to have certain strengths. The materials of the three may be the same or different. The specific material may be polyimide (PI), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads 46, the first microphone element 432a, and the second microphone element 432b, and be not specifically limited herein.

As used herein, the rigid support plate 4a, the rigid support plate 4b1, and the rigid support plate 4b2 may be three different regions of an entire rigid support plate, or three independent bodies spaced apart from each other, and be not specifically limited herein.

In some embodiments, the first microphone element 432a and the second microphone element 432b may correspond to two microphone assemblies 4c (also referred to as a dual-microphone assembly), respectively. In some embodiments, the structures of the two microphone assemblies 4c may be the same. A sound inlet 413 may be disposed on the core housing 41. Further, the speaker may be disposed with an annular blocking wall 414 integrally formed on the inner surface of the core housing 41 at the core housing 41, and disposed at the periphery of the sound inlet 413, thereby defining an accommodation space 415 connected to the sound inlet 413.

In some embodiments, the first flexible circuit board 44 may be disposed between a rigid support plate and the microphone 432. A sound input 444 may be disposed at a position corresponding to a sound input 4b3 of the microphone rigid support plate 4b.

Further, the first flexible circuit board 44 may extend away from the microphone 432, so as to be connected to other functional components or wires to implement corresponding functions. Correspondingly, the microphone rigid support plate 4b may also extend out a distance with the first flexible circuit board 44 in a direction away from the microphone 432.

Correspondingly, the annular blocking wall 414 may be disposed with a gap matching the shape of the first flexible circuit board 44 to allow the first flexible circuit board 44 to extend out of the accommodation space 415. In addition, the gap may be further filled with a sealant to further improve the sealing.

Figure 4:
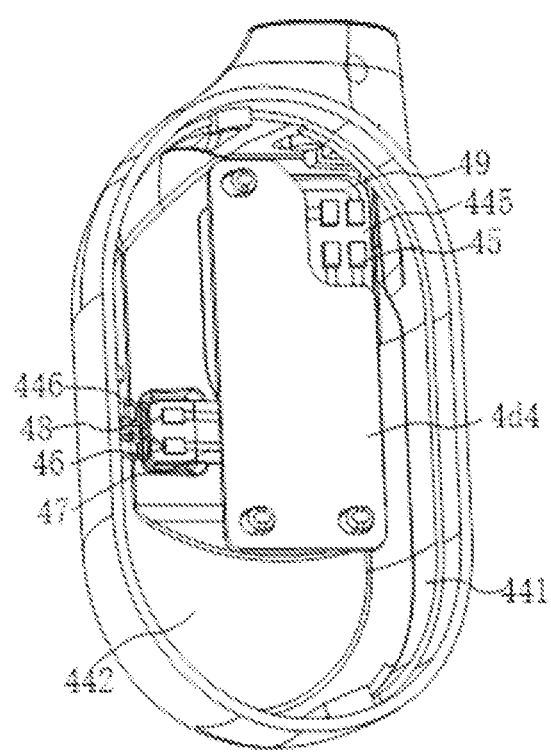
FIG. 4 is a schematic diagram illustrating a partial sectional view of an exemplary speaker according to some embodiments of the present disclosure.
Figure 5:
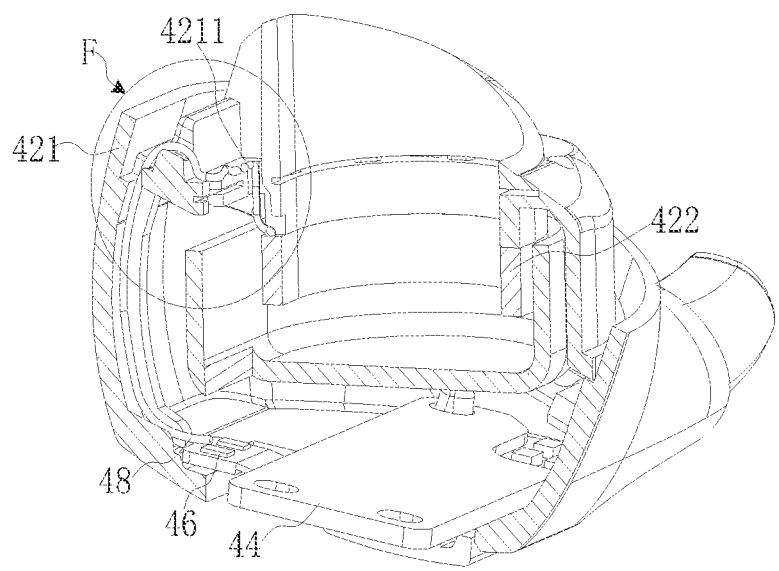
FIG. 5 is a schematic diagram illustrating a partial sectional view of an exemplary speaker according to some embodiments of the present disclosure.
Figure 6:
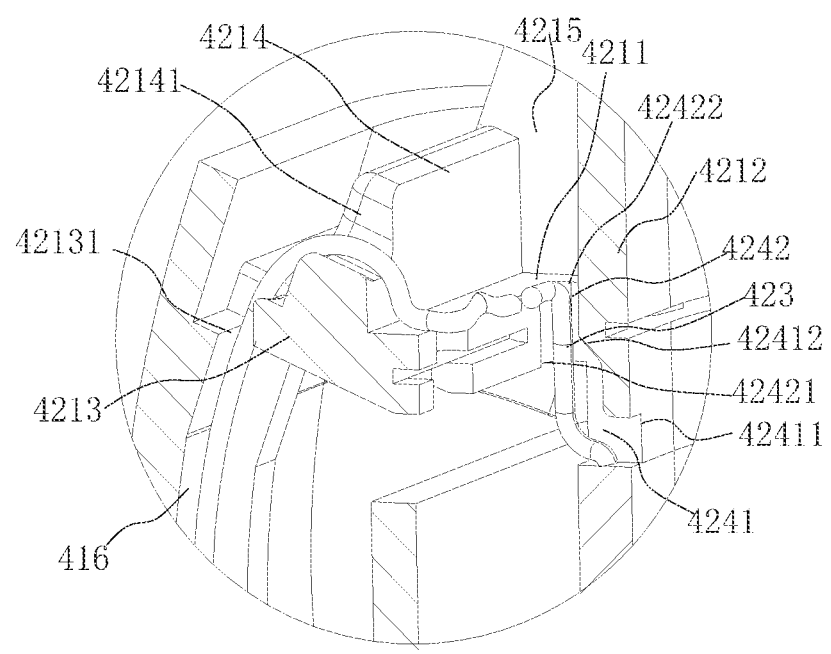
FIG. 6 is a schematic diagram illustrating a partial enlarged view of part F of a speaker in FIG. 5 according to some embodiments of the present disclosure.

FIG. 4 is a schematic diagram illustrating a partial sectional view of an exemplary speaker according to some embodiments of the present disclosure. FIG. 5 is a schematic diagram illustrating a partial sectional view of an exemplary speaker according to some embodiments of the present disclosure. FIG. 6 is a schematic diagram illustrating a partial enlarged view of part F of a speaker in FIG. 5 according to some embodiments of the present disclosure. In some embodiments, as shown in FIGS. 4 to 6, the first flexible circuit board 44 may include a main circuit board 445 and a branch circuit board 446. The branch circuit board 446 may extend along an extending direction perpendicular to the main circuit board 445. As used herein, a plurality of first pads 45 may be disposed at the end of the main circuit board 445 away from the branch circuit board 446. A key switch may be mounted on the main circuit board 445. The second pads 46 may be disposed at the end of the branch circuit boards 446 away from the main circuit board 445.

In some embodiments, a board surface of the first flexible circuit board 44 and the bottom end wall 412 may be disposed in parallel and at intervals, so that the key switch 431 may be disposed towards the bottom end wall 412 of the core housing 41.

As described above, the earphone core 42 may include a magnetic circuit component, a vibration component, an external wire 48, and a bracket 421. As used herein, the vibration component may include coil(s) 422 and an inner lead 423. The external wire 48 may transmit an audio current to the coils in the vibration component. One end of the external wire 48 may be connected to the inner lead 423 of the earphone core 42, and the other end may be connected to the flexible circuit board 44 of a speaker. The bracket 421 may be configured to support and protect the earphone core 42. The bracket 421 may include a wiring groove 4211. At least a portion of the external wire 48 and/or the inner lead may be disposed in the wiring groove 4211. The wiring groove 4211 may be configured to accommodate leads of the earphone core 42. In some embodiments, the inner lead 423 and the external wire may be welded to each other. A welding position may be located in the wiring groove 4211.

In some embodiments, the coil(s) 422 may be disposed on the bracket 421 and have at least one inner lead 423. One end of the inner lead(s) 423 may be connected to a main circuit in the coil(s) 422 to lead out the main circuit and transmit an audio current to the coil(s) 422 through the inner lead 423.

One end of the external wire 48 may be connected to the inner lead(s) 423. Further, the other end of the external wire 48 may be connected to a control circuit 51 to transmit the audio current through the control circuit to the coil(s) 422 through the inner lead 423.

Specifically, during an assembly stage, the external wire 48 and the inner lead(s) 423 may need to be connected together by means of welding, or the like. Due to structural and other factors, after the welding is completed, the length of the wire may not be exactly the same as a length of a channel, and there may be an excess length part of the wire. And if the excess length part of the wire is not disposed reasonably, it may vibrate with the vibration of the coil(s) 422, thereby making an abnormal sound and affecting the sound quality of the earphone core 42.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core 42.

In some embodiments, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil(s) 422. Specifically, a cross-section of the annular main body 4212 in a direction perpendicular to the radial direction of a ring of the annular main body 4212 may be consistent with the coil(s) 422. The coil(s) 422 may be disposed at an end of the annular main body 4212 facing the core housing 41. The inner side wall and the outer side wall of the annular main body 4212 may be flush with the inner side wall and the outer side wall of the coil(s) 422, respectively, so that the inner side wall of the coil(s) 422 and the inner side wall of the annular main body 4212 may be coplanar, and the outer side wall of the coil(s) 422 and the outer side wall of the annular main body 4212 may be coplanar.

Further, the support flange 4213 may protrude on the outer side wall of the annular main body 4212 and extend along the outside of the annular main body 4212. Specifically, the support flange 4213 may extend outward in a direction perpendicular to the outer side wall of the annular main body 4212. As used herein, the support flange 4213 may be disposed at a position between two ends of the annular main body 4212. In some embodiments, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil(s) 422 at intervals. Specifically, the outer blocking wall 4214 may be partially sleeved around the periphery of the annular main body 4212 and the coil(s) 422 according to actual needs, or partially sleeved around the periphery of the annular main body 4212. It should be noted that, In some embodiments, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing 41. As used herein, the outer side wall of the annular main body 4212, the side wall of the support flange 4213 away from the core housing 41, and the inner side wall of the outer blocking wall 4214 may together define the wiring groove 4211.

In some embodiments, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil(s) 422. A wiring port 42412 communicating with the other end of the sub-wiring channel 4241 may be disposed on a side of the core housing near the support flange 4213 facing the core housing 41. The sub-wiring channel 4242 may penetrate the support flange 4213 in a direction towards the outside of the core housing 41. The wiring port 42421 communicating with the end of the sub-wiring channel 4242 may be disposed on a side of the support flange 4213 facing the core housing 41. The wiring port 42422 communicating with the other end of the sub-wiring channel 4242 may be disposed on a side away from the core housing 41. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In some embodiments, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core 42 facing the core housing 41.

In some embodiments, the support flange 4213 may be further extended to a side of the outer blocking wall 4214 away from the annular main body 4212 to form an outer edge. Further, the outer edge may surround and abut on the inner side wall of the core housing 41. Specifically, the outer edge of the support flange 4213 may be disposed with a slot 42131, so that the external wire 48 on the inner side of the earphone core 42 facing the core housing 41 may be extended to the outer side of the support flange 4213 facing the core housing 41 through the slot 42131, and then to the slot 42141, and enter the wiring groove 4211 through the slot 42141.

Further, the inner side wall of the core housing 41 may be disposed with a guide groove 416. One end of the guide groove 416 may be located on one side of the flexible circuit board 44 and the other end may communicate with the slot 42131 and extend in a direction towards the outside of the core housing 41, so that the external wire 48 extends from the flexible circuit board to a second wiring groove 3331 by passing through the guide slot 416.

In some embodiments, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing 41 along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the external wire 48 entering through the slot 42141 may extend into the wiring groove 4211 defined by the two side blocking walls 4215.

It should be noted that the above description of the wiring process of the speaker is merely provided for the purposes of illustration, and should not be regarded as the only feasible implementation. Obviously, for those skilled in the art, after understanding the basic principle of the wiring process of the speaker, multiple modifications and variations to the specific means and details of the wiring process of the speaker may be made without departing from this principle. However, these modifications and variations do not depart from the scope of the present disclosure. For example, the branch circuit board may include a third pad and a third auxiliary circuit board. Such deformations are all within the protection scope of the present disclosure.

Figure 7:
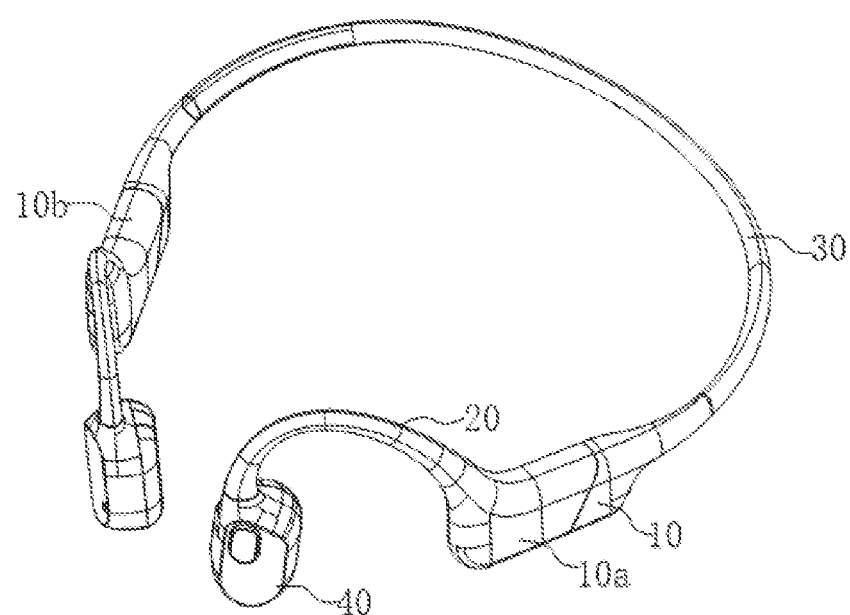
FIG. 7 is a schematic structural diagram illustrating an exemplary speaker according to some embodiments of the present disclosure.
Figure 8:
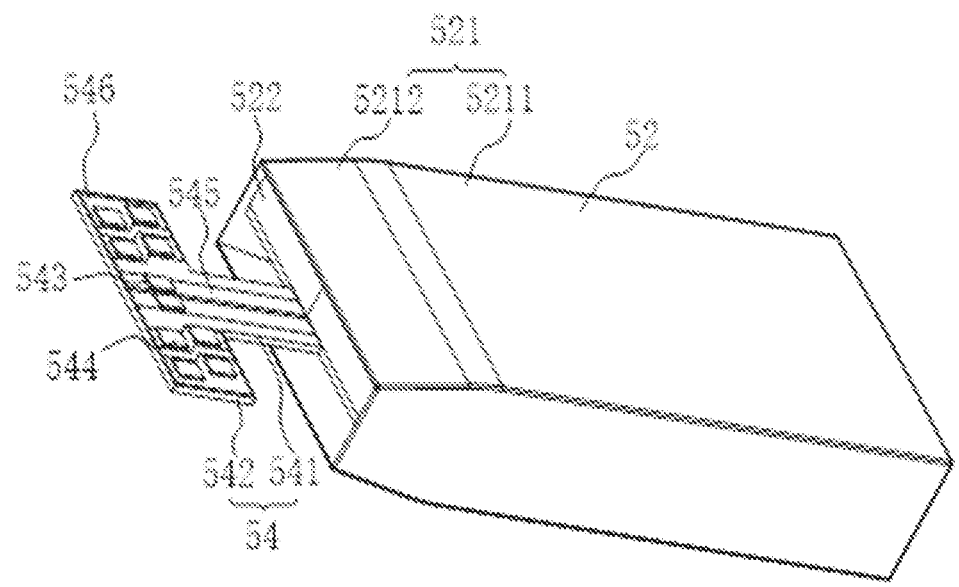
FIG. 8 is a schematic structural diagram illustrating an exemplary battery assembly of a speaker according to some embodiments of the present disclosure.
Figure 9:
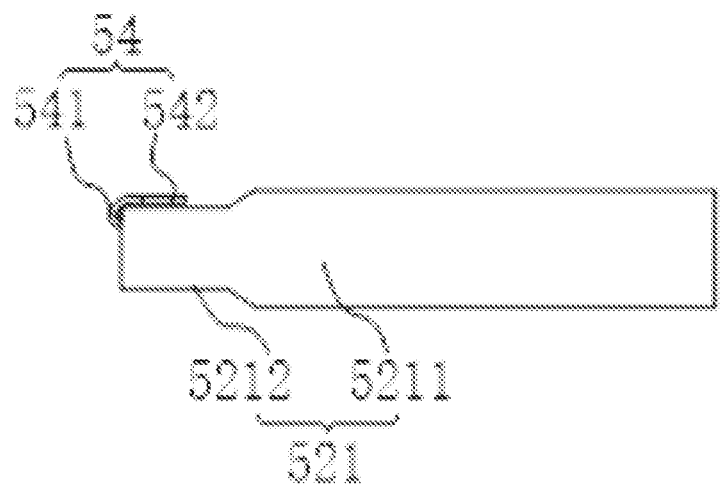
FIG. 9 is a schematic structural diagram illustrating an exemplary battery assembly of a speaker according to some embodiments of the present disclosure.
Figure 10:
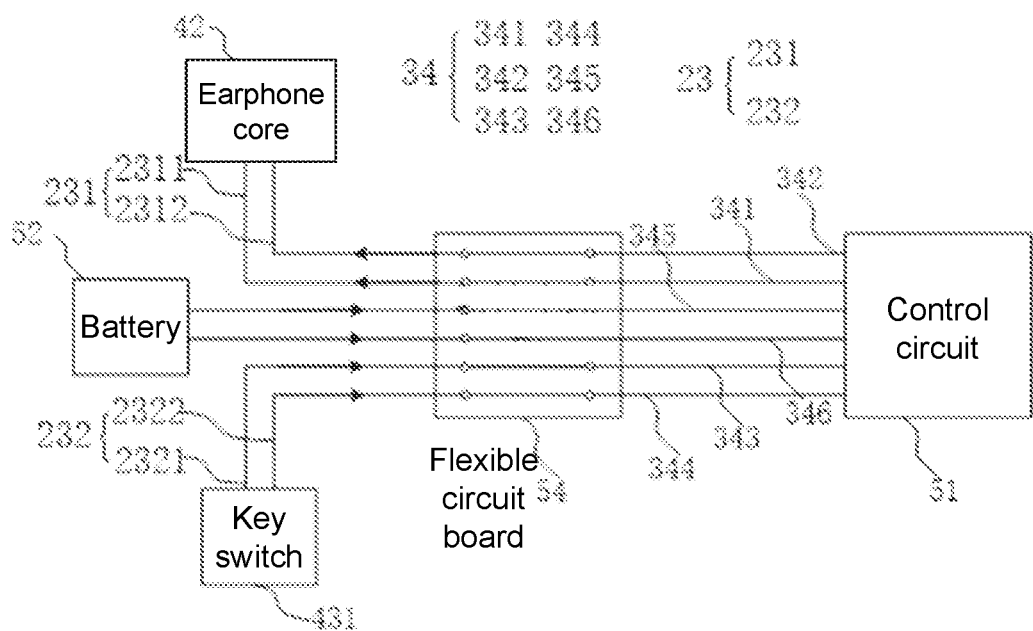
FIG. 10 is a schematic diagram of a flexible circuit board wiring at a battery according to some embodiments of the present disclosure.

FIG. 7 is a schematic structural diagram illustrating an exemplary speaker according to some embodiments of the present disclosure. FIG. 8 is a schematic structural diagram illustrating an exemplary battery assembly of a speaker according to some embodiments of the present disclosure. FIG. 9 is a schematic structural diagram illustrating an exemplary battery assembly of a speaker according to some embodiments of the present disclosure. FIG. 10 is a schematic diagram of a flexible circuit board wiring at a battery according to some embodiments of the present disclosure. According to FIG. 7 to FIG. 10, in some embodiments, as described in the previous embodiments, the fixing mechanism 210 may include a circuit housing 10, an ear hook 20, a rear hook 30, etc., for fixing the speaker to the human body. Further, a battery assembly and a control circuit may be disposed in the fixing mechanism 210. The battery assembly may include a battery 52 having a positive terminal and a negative terminal. Furthermore, the circuit housing 10 may include a first circuit housing 10*a* (as shown in FIG. 7) and a second circuit housing 10*b* (as shown in FIG. 7). Furthermore, the loudspeaker device may include a second flexible circuit board 54 that can be accommodated together with the battery 52 in an accommodation cavity (not shown in the figure) of the first circuit housing 10a. The second flexible circuit board 54 may be a flexible printed circuit (FPC).

The second flexible circuit board 54 may include a first board 541 and a second board 542. One end of the first board 541 may be fixed to the battery 52 and the other end may be connected to the second board 542. The second flexible circuit board 54 may be a whole body, and the first board 541 and the second board 542 may be two areas of the whole body. The second board 542 may be provided with pads and flexible leads connecting the pads. The first board 541 may only be provided with flexible leads for connecting the corresponding pads on the second board 542 to battery 52. Since only flexible leads are provided on the first board 541, the first board 541 may be bent, as shown in FIG. 9, so that the position of the second flexible circuit board 54 may be adjusted according to requirements.

A plurality of pads may be disposed on the second board 542 at intervals, and the plurality of pads may include two third pads 543 and a plurality of fourth pads 544. Further, two consecutive third flexible leads 545 may be commonly disposed on the first board 541 and the second board 542. The two third pads 543 may be electrically connected to the positive and negative terminals of the battery 52 by the two third flexible leads 545, respectively.

It should be noted that the first, second, third and fourth pads in the foregoing embodiments may be the same object.

In addition, the plurality of fourth pads 544 may be divided into at least two groups, and a count or number of the fourth pads 544 in each group may be set according to requirements. For example, the count or number of the fourth pads 544 in each group may be two. In addition, the two fourth pads 544 may be electrically connected to each other by the fourth flexible leads 546 disposed on the second board 542. The two fourth pads 544 in each group may be connected to functional elements through wires respectively. Therefore, the two corresponding functional elements may be connected together through the fourth flexible lead 546.

It should be noted that the first, second, third and fourth flexible leads in the foregoing embodiments may be the same object.

In some embodiments, on the one hand, the pads used for circuit switching may be all disposed on the second board 542 of the second flexible circuit board 54 and connected to the battery 52 via the first board 541 of the second flexible circuit board 54, so that the first board 541 may be bent according to space requirements to place the second board 542, thereby optimizing the space utilization of the accommodating cavity of the first circuit housing 10a and improving the space utilization. On the other hand, the two third pads 543 may be directly connected to the positive and negative terminals of the battery 52 through the third flexible lead 545 on the second flexible circuit board 54. There is no need to provide additional pads to lead the positive and negative electrodes of the battery 52, thereby reducing the count or number of pads and simplifying the structure and process.

In some embodiments, the first board 541 may be further folded and arranged so that the second board 542 may be attached to the side surface of the battery 52, and the first board 541 and the battery 52 may be stacked, thereby greatly reducing the space occupied by the battery 52 and the second flexible circuit board 54.

Specifically, the battery 52 may include a battery cell 521. The battery cell 521 may include a body region 5211 and a sealing region 5212. The body region 5211 and the sealing region 5212 may be laid flat, and the thickness of the body region 5211 may be greater than the thickness of the sealing region 5212, thereby making the side surface of the sealing region 5212 and the side surface of the body region 5211 being arranged in a stepped manner.

Specifically, the side surfaces of the sealing region 5212 and the body region 5211 in the thickness direction of the battery cell 521 may be arranged in a stepped manner, so that the second board 542 may use the space formed by the body region 5211 and the sealing region 5212 of the battery cell 521. There is no need to provide a separate space for placing the second flexible circuit board 54, thereby further improving the space utilization.

In some embodiments, the battery 52 may further include a hard circuit board 522 disposed on the side surface of the sealing region 5212 of the battery cell 521. Specifically, the positive terminal and the negative terminal may be disposed on the hard circuit board 522, and a protection circuit (not shown) may be further disposed on the hard circuit board 522, so as to protect the battery 52 from overload by the protection circuit.

In some embodiments, the end of the first board 541 away from the second board 542 may be attached and fixed to the hard circuit board 522, so that the two flexible leads on the first board 541 may be connected to the positive terminal and the negative terminal of the hard circuit board 522. Specifically, the first board 541 and the hard circuit board 522 may be directly pressed together in the manufacturing stage.

In some embodiments, the shape of the first board 541 and the second board 542 may be set according to actual conditions. In some embodiments, the shape of the first board 541 may match the shape of the sealing region 5212 of the battery cell 521, and the shapes of the first board 541 and the sealing region 5212 of the battery cell 521 may be elongated rectangles. The shape of the second board 542 may also be rectangular. The second board 542 may be disposed on one end of the first board 541 in the length direction and may be perpendicular to the first board 541 along the length direction. In some embodiments, the first board 541 may be connected to the middle area of the second board 542 in the length direction, so that the first board 541 and the second board 542 may be arranged in a T shape.

In some embodiments, on the second board 542, the third pads 543 and the fourth pads 544 may be arranged in multiple ways. For example, all the pads may be arranged at intervals along a straight line or arranged at intervals in other shapes.

In some embodiments, the two third pads 543 may be disposed in the middle area of the second board 542 at intervals along the length direction of the second board 542, and a plurality of fourth pads 544 may be further distributed on two sides of the two third pads 543 along the length direction of the second board 542, and the fourth pads 544 in each group may be adjacently arranged. As used herein, a plurality of fourth pads 544 being distributed on two sides of the two third pads 543 refers to that the two third pads are a whole, and the plurality of fourth pads are distributed on two sides of the whole two third pads.

In some embodiments, the fourth pads 544 in each group may be arranged at intervals along the width direction of the second board 542, and may be staggered from each other along the length direction of the second board 542, so that the fourth pads 544 in each group may be arranged along stepped intervals. In this way, on the one hand, it is possible to avoid the formation of a flush space between the two adjacent groups of fourth pads 544, thereby making the intensity distribution on the second board 542 uniform, and reducing the occurrence of bending between the two adjacent groups of fourth pads 544, and reducing the probability that the second board 542 is broken due to bending, so as to protect the second board 542. On the other hand, the distance between the pads may be increased to facilitate soldering and reduce short circuits between different pads.

The present disclosure also provides a battery assembly. In an embodiment of the battery assembly, the battery assembly may include the battery 52 and the second flexible circuit board 54 in the foregoing embodiment. The battery assembly in this embodiment may be applied to devices such as earphones, MP3 devices, etc., that require circuit switching at the battery 52. For example, the battery assembly may be used to the loudspeaker device in the present disclosure.

In some embodiments, the rear hook 30 may be connected to one end of the first circuit housing 10*a*, and may be provided with a plurality of rear hook wires 34 (shown in FIG. 10). The ear hook 20 may be connected to the other end of the first circuit housing 10*a*, and may be provided with a plurality of ear hook wires 23.

Each group of fourth pads 544 may include two fourth pads 544, and the ear hook wires 23 and the corresponding rear hook wires 34 may be electrically connected to the two fourth pads 544 in the same group of fourth pads 544. Therefore, the functional element connected to the rear hook wire 34 and the functional element connected to the ear hook wire 23 may be connect together through the two fourth pads 544 connecting the fourth flexible leads 546 in each group.

In some embodiments, the core housing 41 may further include functional modules such as the key switch 431. In addition, the control circuit 51 may be included in the second circuit housing 10*b*. There may be four groups of the fourth pads 544 on the second board 542.

The ear hook wire 23 may include two audio signal wires 231, i.e., the first ear hook wire 2311 and the second ear hook wire 2312 connected to the earphone core 42. The rear hook wire 34 may include the first rear hook wire 341 and the second rear hook wire 342 that are connected to the control circuit 51 and are used to transmit the audio signal to the earphone core 42. Further, the first ear hook wire 2311 and the first rear hook wire 341, and the second ear hook wire 2312 and the second rear hook wire 342 may be respectively connected to different pads in different groups of the two groups of fourth pads 544. Specifically, the first ear hook wire 2311 and the first rear hook wire 341 may be respectively connected to the two fourth pads 544 in the same group of fourth pads 544, and the second ear hook wire 2312 and the second rear hook wire 342 may be respectively connected to the two fourth pads 544 of the other group of fourth pads 544, thereby electrically connecting the earphone core 42 and the control circuit 51 together to realize the transmission of audio signals.

In addition, the ear hook wire 23 may also include at least two auxiliary signal wires 232, for example, a third ear hook wire 2321 and a fourth ear hook wire 2322 connected to the key switch 431. Correspondingly, the rear hook wire 34 may also include a third rear hook wire 343 and a fourth rear hook wire 344 that are connected to the control circuit 51 and are used to transmit key signals to the key switch 431. Further, the third ear hook wire 2321 and the third rear hook wire 343, and the fourth ear hook wire 2322 and the fourth rear hook wire 344 may be respectively connected to different pads in different groups of the two groups of fourth pads 544. The two groups of fourth pads 544 may be different from the two groups of fourth pads 544 that realize the transmission of audio signals to the earphone core 42 described above. Further, the third ear hook wire 2321 and the third rear hook wire 343 may be respectively connected to two fourth pads 544 in the same group of fourth pads 544, and the fourth ear hook wire 2322 and the fourth rear hook wire 344 may be respectively connected to two fourth pads 544 in another group of fourth pads 544, thereby electrically connecting the key switch 431 and the control circuit 51 together to realize the transmission of key signals.

Further, the rear hook wire 34 may also include a fifth rear hook wire 345 and a sixth rear hook wire 346 connected to the control circuit 51 and used to supply power to the control circuit 51. The fifth rear hook wire 345 and the sixth rear hook wire 346 may be connected to two third pads 543 respectively, thereby connecting the battery 52 and the control circuit 51 together.

It should be noted that the above description of the FPC of the battery of the loudspeaker device is merely provided for the purposes of illustration, and should not be regarded as the only feasible implementation. Obviously, for those skilled in the art, after understanding the basic principle of the loudspeaker device, multiple modifications and variations to the specific means and details of the FPC of the battery of the loudspeaker device may be made without departing from this principle. However, these modifications and variations do not depart from the scope of the present disclosure. For example, the core housing 41 may further contain auxiliary function modules such as a voice control module, a microphone element, etc. Such deformations are all within the protection scope of the present disclosure.

Figure 11:
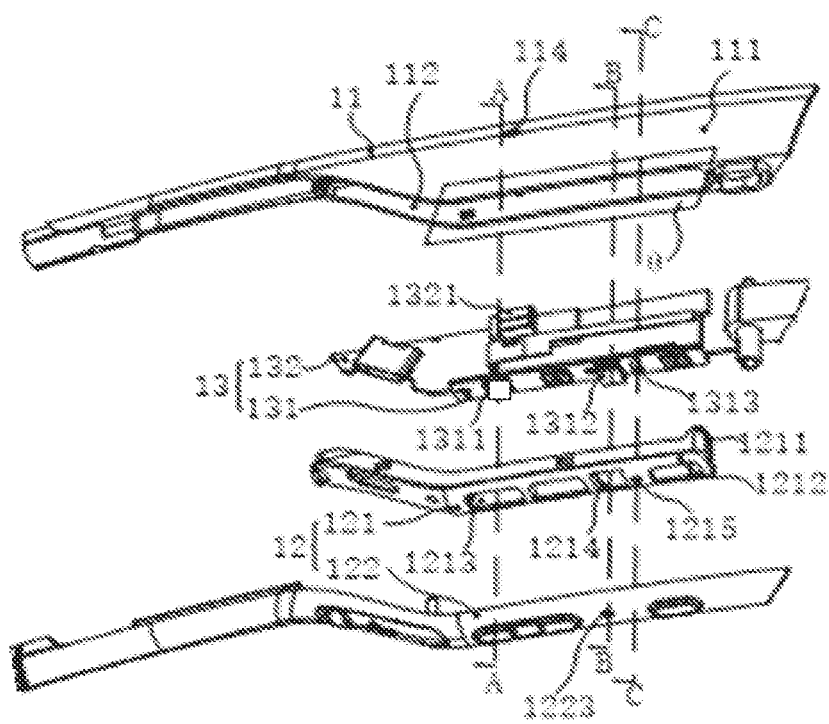
FIG. 11 is an exploded diagram illustrating an exemplary loudspeaker device according to some embodiments of the present disclosure.
Figure 12:
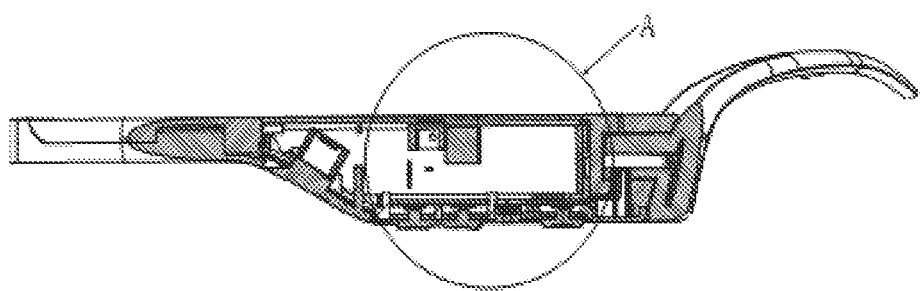
FIG. 12 is a schematic diagram illustrating a cross-sectional view of a partial structure of a loudspeaker device according to some embodiments of the present disclosure.
Figure 13:
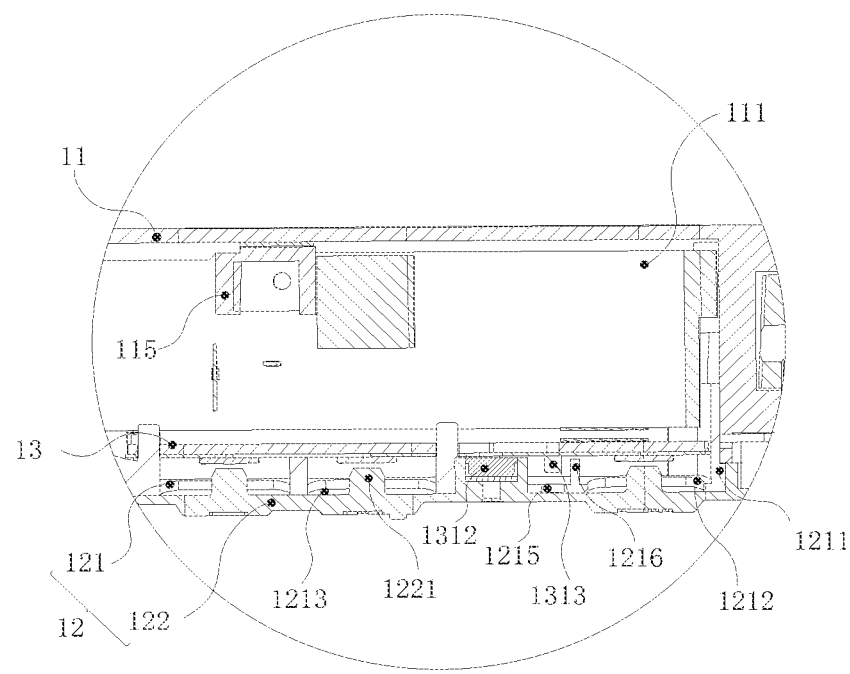
FIG. 13 is a schematic diagram illustrating an enlarged view of part A in FIG. 12.

FIG. 11 is an exploded diagram illustrating an exemplary loudspeaker device according to some embodiments of the present disclosure. FIG. 12 is a schematic diagram illustrating a cross-sectional view of a partial structure of a loudspeaker device according to some embodiments of the present disclosure. FIG. 13 is a schematic diagram illustrating an enlarged view of part A in FIG. 12. According to FIGS. 11-13, in some embodiments, the loudspeaker device may include a component body. A cavity 111 may be formed inside the component body. It should be noted that the component body may be equivalent to the circuit housing 10 mentioned in the foregoing embodiments.

The component body may be a structure formed by combining at least two parts. The component body may also be a structure manufactured by an integral molding technology, such as a structure integrally formed by an integral injection molding process. The spatial shape of the component body may include, but is not limited to, a rectangular parallelepiped, a cube, an ellipsoid, a sphere, a cone, and other irregular spatial shapes. The material of the component body may include but is not limited to one or a combination of plastic, silica gel, rubber, plastic, glass, ceramic, alloy, stainless steel, etc.

In some embodiments, the component body may include an accommodating body 11 and a cover 12. The interior of the accommodating body 11 may be hollow to form a cavity 111. The accommodating body 11 may be provided with an opening 112 connected with the cavity 111. The cover 12 may be placed on the opening 112 of the cavity 111 for sealing the cavity 111. The cavity 111 may be an internal cavity formed by two or more components when assembled, or may be an internal cavity formed according to the shape of the molding die during the integral molding process of the components. The cavity 111 may be used to accommodate multiple electronic components and circuit structures of the loudspeaker device. The component body may be used to seal the cavity 111. The cavity 111 may be completely sealed by the component body, or jointly sealed by the component body and other accessories on the component body.

It should be noted that the accommodating body 11 may be equivalent to the peripheral side wall in the foregoing embodiment, and the cover body 12 may be equivalent to the bottom end wall in the foregoing embodiment.

The accommodating body 11 may be at least a part of the loudspeaker device. The accommodating body 11 in this embodiment may specifically be a structure for holding, for example, a circuit board, a battery 52, and electronic components in the loudspeaker device. For example, the accommodating body 11 may be the whole or a part of the housing of the loudspeaker device.

In addition, the accommodating body 11 may be provided with a cavity 111 having an opening 112 for accommodating the above-mentioned circuit board, battery, electronic components, etc. The opening 112 may communicate with the cavity and be used for the mounting and dismounting passages of the circuit boards, batteries, electronic components, or the like. Specifically, a count or number of openings 112 may be one or multiple, which is not limited here.

In some embodiments, the shape of the cover 12 may at least partially match the opening 112, such that the cover 12 may be placed on the opening 112 to seal the cavity 111. The material of cover 12 may be different from or partially the same as the accommodating body 11.

In some embodiments, the cover 12 may include a hard bracket 121 and a soft cover layer 122. The hard bracket 121 may be used to physically connect to the accommodating body 11. The soft cover layer 122 may be integrated on the surface of the hard bracket 121 to seal the cavity 111 after the hard bracket 121 is connected to the accommodating body 11.

Specifically, the material of the hard bracket 121 may be rigid plastic, and the material of the soft cover layer 122 may be soft silicone or rubber. A shape of the side of the hard bracket 121 facing toward the accommodating body 11 may match the opening 112, and fixed to the opening 112 of the cavity 111 by means of plugging, buckling, etc., so as to physically connect to the accommodating body 11. A gap may be easily formed at a physical connection portion between the hard bracket 121 and the accommodating body 11, which may reduce a sealing effect of the cavity 111. Further, the soft cover layer 122 may be injection molded integrally on an outer surface of the hard bracket 121 away from the accommodating body 11, which may further cover the physical connection portion between the hard bracket 121 and the accommodating body 11, thereby sealing the cavity 111.

In some embodiments, the cover 12 may include the hard bracket 121 and the soft cover layer 122 injection-molded integrally on a surface of the hard bracket 121. The hard bracket 121 may be used to physically connect to the accommodating body 11. The soft cover layer 122 may further seal the cavity 111 after the hard bracket 121 is connected to the accommodating body 11. The soft cover layer 122 may be more conducive to fit the gap between the hard bracket 121 and the accommodating body 11, so as to further improve the sealing effect of the electronic component, thereby improving the waterproof performance of the electronic component. At the same time, the hard bracket 121 and the soft cover layer 122 may be injection molded integrally, which can simplify an assembly process of electronic components.

In some embodiments, the hard bracket 121 may include an insertion part 1211 and a cover part 1212. The cover part 1212 may be placed on the opening 112, and the insertion part 1211 may be placed on one side of the cover part 1212 and extend into the cavity 111 along an inner wall of the cavity 111 to fix the cover part 1212 on the opening 112.

In an application scenario, the insertion part 1211 may not be inserted through the inner wall of cavity 111. For example, a plug-in part matching a shape of the insertion part 1211 of the hard bracket 121 may also be placed inside the cavity 111, such that the insertion part 1211 may be engaged with the plug-in part to fix the plug-in part inside the cavity 111. For example, the shape of insertion part 1211 may be a cylinder. In such cases, a plug-in part may be a cylindrical ring that surrounds the insertion part 1211 of the shape of the cylinder. An inner diameter of the plug-in part of the cylindrical ring may be appropriately less than an outer diameter of the plug-in part of the cylindrical body. In such cases, when inserting the insertion part 1211 in the plug-in part, an interference fit with the plug-in part may make the hard bracket 121 be stably connected to the cavity 111. Of course, other insertion methods may also be used, as long as the insertion part 1211 may be inserted into the cavity 111 and fixed with the cavity 111.

In some embodiments, the cover part 1212 may be placed on a side of the insertion part 1211 facing away from the cavity 111, and cover the opening 112 after the insertion part 1211 is inserted into the cavity 111. The cover part 1212 may be a complete structure, or may further include some holes according to needs, so as to achieve a certain function.

Figure 14:
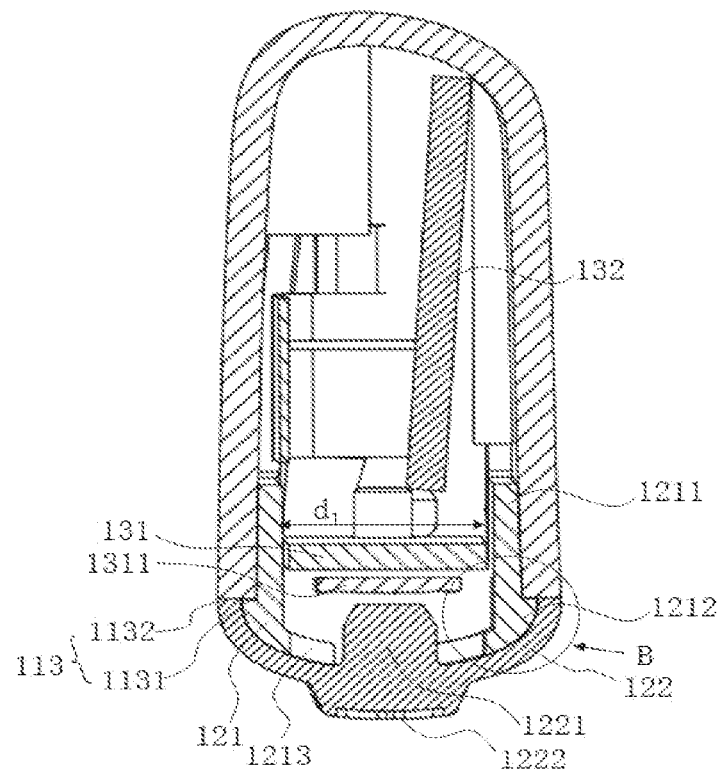
FIG. 14 is a schematic diagram illustrating a cross-section view of a loudspeaker device in an assembled state along an A-A axis in FIG. 11.

FIG. 14 is a schematic diagram illustrating a cross-section view of a loudspeaker device in an assembled state along an A-A axis in FIG. 11. In some embodiments, according to FIG. 14, the accommodating body 11 may include an opening edge 113 for defining the opening 112. A cover part 1212 may be pressed on an inner region 1131 of the opening edge 113 near the opening 112. The soft cover layer 122 may cover an outer surface of the cover part 1212 away from the accommodating body 11, and may be pressed on an outer region 1132 outside the inner region 1131 of the opening edge 113, thereby sealing the soft cover layer 122 and the opening edge 113.

The inner region 1131 and the outer region 1132 of the opening edge 113 may both belong to the opening edge 113, instead of regions other than the opening edge 113. The inner region 1131 of the opening edge 113 may be a region near the opening 112 of the opening edge 113, and the outer region 1132 of the opening edge 113 may be a region away from the opening 112 of the opening edge 113.

In some embodiments, the cover part 1212 of the hard bracket 121 may be pressed on the inner region 1131 of the opening edge 113 near the opening 112, which causes the cover part 1212 to initially seal the opening edge 113. However, since the accommodating body 11 and the hard bracket 121 are made of hard materials, a connection therebetween and a further coverage of the connection by the cover part 1212 may not achieve a good sealing effect. At an end where the cover part 1212 is pressed on the opening edge 113 and away from the opening 112, a gap between the end and the opening edge 113 may be easily generated. The end may further penetrate the cavity 111 through the gap, thereby reducing the sealing effect.

According to the descriptions above, in some embodiments of the present disclosure, the soft cover layer 122 may cover the outer surface of the cover part 1212 away from the accommodating body 11, and may be further pressed on the outer region 1132 outside the inner region 1131 of the opening edge 113, such that the gap between the cover part 1212 of the hard bracket 121 and the opening edge 113 may be further covered. Since the soft cover layer 122 is made of a soft material, it can further improve the sealing effect of the loudspeaker device and make the loudspeaker device more waterproof.

Figure 15:
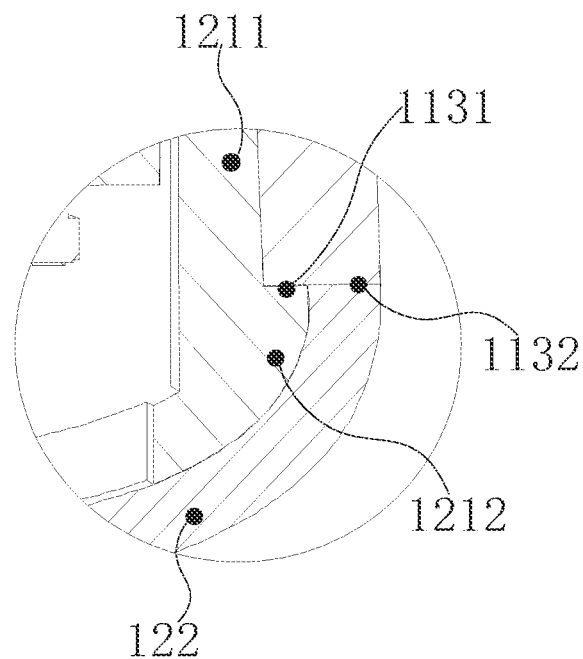
FIG. 15 is a schematic diagram illustrating an enlarged view of part B in FIG. 14.

FIG. 15 is a schematic diagram illustrating an enlarged view of part B in FIG. 14. In an application scenario, in a snapped state of the cover 12, a periphery of the cover part 1212 may cover the inner region 1131 of the opening edge 113 and contact the inner region 1131 of the opening edge 113. The soft cover layer 122 may be placed on a side of the cover part 1212 away from the accommodating body 11, such that the cover part 1212 of the inner region 1131 located at the opening edge 113 may be sandwiched between the inner region 1131 and the soft cover layer 122 of the opening edge 113. The soft cover layer 122 may further extend toward the cover part 1212 away from the opening 112, and toward the opening edge 113, until it contacts the outer region 1132 of the opening edge 113. Therefore, a contact end surface between the cover part 1212 and the opening edge 113 and a contact end surface between the soft cover layer 122 and the opening edge 113 may be flush with each other, so as to form an "opening edge 113-cover part 1212-soft cover layer 122" structure on the inner region 1131 of the opening edge 113.

Figure 16:
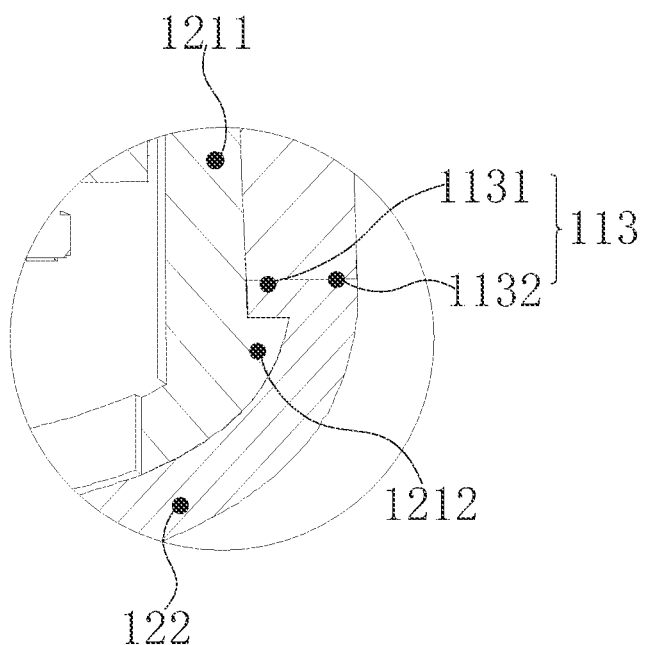
FIG. 16 is a schematic diagram illustrating a partial cross-section view of a loudspeaker device according to some embodiments of the present disclosure.

FIG. 16 is a schematic diagram illustrating a partial cross-section view of a loudspeaker device according to some embodiments of the present disclosure. In some embodiments, according to FIG. 16, after the soft cover layer 122 extends to contact the outer region 1132 of the opening edge 113, the soft cover layer 122 may further extend along a region between the cover part 1212 and the opening edge 113 to the inner region 1131 of the opening edge 113. It is further assumed that, the cover part 1212 may be pressed on the inner region 1131 of the opening edge 113 to form an "opening edge 113-soft cover layer 122-cover part 1212-soft cover layer 122" structure between the inner region 1131 of the opening edge 113 and the cover part 1212. In some embodiments, the soft cover layer 122 may extend between the hard bracket 121 and the opening edge 113 after covering the cover part 1212 of the hard bracket 121, thereby further improving the sealing effect between the cavity 111 and the cover 12, and further improving the waterproof effect of the loudspeaker device.

In some embodiments, referring to FIGS. 11-16, the loudspeaker device may further include a circuit component 13 placed in the cavity 111, and the circuit component 13 may include a switch 1311.

Specifically, the circuit component 13 may include a first circuit board 131, and the switch 1311 may be placed on an outer side of the first circuit board 131 facing toward the opening 112 of the cavity 111. A count or number of the switches 1311 may be one or multiple. When the count or number of switches 1311 is multiple, the switches 1311 can be arranged on the first circuit board 131 at intervals. It should be noted that the first circuit board 131 may be equivalent to the first branch circuit board in the foregoing embodiment.

Correspondingly, the hard bracket 121 may include a switch hole 1213 corresponding to the switch 1311. The soft cover layer 122 may further cover the switch hole 1213 and may include a pressing part 1221 at a position corresponding to the switch hole 1213. The pressing part 1221 may extend toward the inside of the cavity 111 through the switch hole 1213. When a corresponding position of the soft cover layer 122 is pressed, the pressing part 1221 may press the switch 1311 on the circuit component 13, thereby triggering the circuit component 13 to perform a preset function.

The pressing part 1221 on the soft cover layer 122 may be formed by protruding a side of the soft cover layer 122 facing toward the hard bracket 121 toward the switch hole 1213 and the switch 1311. A shape of the pressing part 1221 may match a shape of the switch hole 1213. In this way, when the corresponding position of the soft cover layer 122 is pressed, the pressing part 1221 may pass through the switch hole 1213 and reach the corresponding switch 1311 on the first circuit board 131. At the same time, a length of the pressing part 1221 along a direction of the switch 1311 may be set such that the switch 1311 is not pressed when the corresponding position of the soft cover layer 122 is not pressed, and the corresponding switch 1311 is pressed when the corresponding position of the soft cover layer 122 is pressed.

In an application scenario, a position corresponding to the pressing part 1221 on the soft cover layer 122 may further be protruded toward a side facing away from the hard bracket 121, so as to form a convex pressing part 1222. In this way, a user may clarify a position of the switch 1311, and trigger the circuit component 13 to perform a corresponding function by pressing the corresponding convex pressing part 1222.

In some embodiments, the auxiliary function module 204 may be used to receive auxiliary signals and perform auxiliary functions. The auxiliary function module 204 may be a module different from the earphone core 42 for receiving auxiliary signals and performing auxiliary functions. Further, the auxiliary function module 204 may implement one or more of the image function, voice function, auxiliary control function, and switch control function. In this application, the conversion of audio signals into sound signals may be considered as the main function of the speaker, and other functions different from the main function may be considered as auxiliary functions of the speaker. For example, the auxiliary function of the speaker may include receiving sounds of the user and/or environment through a microphone, and controlling the playing process of the sound signal through keys.

In some embodiments, the auxiliary function module may include at least a first auxiliary function module and a second auxiliary function module. The first auxiliary function module may be disposed on the main circuit board 445, and the second auxiliary function module may be disposed on the first branch circuit board 442.

In some embodiments, the auxiliary function module may further include a third auxiliary function module, and the third auxiliary function module is disposed on the second branch circuit board.

In some embodiments, the second auxiliary function module may be the first microphone element 1312, and the third auxiliary function module may be the second microphone element 1321. Both the first microphone element 1312 and the second microphone element 1321 may be MEMS (Micro Electro Mechanical System) microphones, which have a small operating current, relatively stable performance, and high quality of voice produced.

It should be noted that the first microphone element 1312 and the second microphone element 1321 may be equivalent to the microphone 432 in the foregoing embodiment.

In some embodiments, the first microphone and the second microphone may be distributed in the loudspeaker device in a specific manner, so that the main sound source (for example, a person's mouth) is located in a direction in which the second microphone element 1321 points to the first microphone element 1312.

In some embodiments, the first microphone element 1312 may be disposed on the side of the first circuit board 131 facing the cover 12, and the second microphone element 1321 may be disposed on the second circuit board 132 facing the accommodating body.

When the user wears the loudspeaker device, since the distances between the mouth (the main sound source) and the first microphone element 1312 and the second microphone element 1321 are less than the distances between other sound sources (for example, noise sources) in the environment and the first microphone element 1312 and the second microphone element 1321, the mouth may be considered as the near-field sound source of the first microphone element 1312 and the second microphone element 1321. For near-field sound sources, the magnitude of the sound received by the two sets of microphone elements may be related to the distance from the sound source. Since the first microphone element 1312 is closer to the main sound source, the first microphone element 1312 may receive greater audio signal $V_{J1}$. Since the second microphone element 1321 is farther from the main sound source, the second microphone element 1321 may receive less audio signals $V_{J2}$ that is, $V_{J1} > V_{J2}$.

Since the noise source in the environment is relatively far away from the first microphone element 1312 and the second microphone element 1321, the noise source in the environment may be considered as the far-field sound source of the first microphone element 1312 and the second microphone element 1321. For far-field sound sources, the amplitudes of the noise signals received by the two sets of microphone elements may be close, i.e., $V_{Y1} \approx V_{Y2}$.

Therefore, the total sound signal received by the first microphone element 1312 may be:

$$V_1 = V_{J1} + V_{Y1}, \tag{1}$$

The total sound signal received by the second group of microphone elements may be:

$$V_2 = V_{J2} + V_{Y2}, \tag{2}$$

In order to eliminate the noise in the received sound signal, the total sound signal of the first microphone element 1312 and the total sound signal of the second microphone element 1321 may be processed by a differential processing. The form of differential processing may be denoted as follows:

$$V = V_1 - V_2 = (V_{J1} - V_{J2}) + (V_{Y1} - V_{Y2}) \approx V_{J1} - V_{J2}, \tag{3}$$

Further, according to the differential result of the signal obtained by Equation (3), and combining with the distance between the first microphone element 1312 and the second microphone element 1321 relative to the main sound source, the audio signal from the main sound source actually obtained by the first microphone element 1312 and/or the second microphone element may be further obtained, that is, $V_{J1}$ or $V_{J2}$.

Therefore, in order to ensure the quality of the audio signal finally obtained, the differential result of the signal obtained in Equation (3) needs be made as large as possible, i.e., $V_{J1} \gg V_{J2}$. In some embodiments of the present disclosure, this effect may be achieved in the following ways: making the installation position of the first microphone element 1312 as close as possible to the main sound source (such as a human mouth); making the installation position of the second microphone element 1321 as far away as possible from the main sound source (such as human mouth); isolating the space of two microphones; setting a sound barrier between the two microphone elements. It should be noted that all of the above methods may achieve the effect of improving the quality of the audio signal, and these methods may be used alone or in combination.

In some embodiments, in order to make the installation position of the first microphone element 1312 as close as possible to the main sound source (such as a human mouth), the first circuit board 131 and the first microphone element 1312 mounted on it may be set to be inclined. In some embodiments, in order to make the installation position of the second microphone element 1321 as far away as possible from the main sound source (such as a human mouth), the second circuit board 132 and the second microphone element 1321 installed on it may be set to be inclined, so as to flexibly adjust the required installation distance. At the same time, corresponding sound guide channels and sound barriers may be arranged in each microphone element installation area. Specific installation methods may be found in FIGS. 17-19 and related descriptions.

It should be noted that the second circuit board 132 may be equivalent to the second branch circuit board in the foregoing embodiment.

Figure 17:
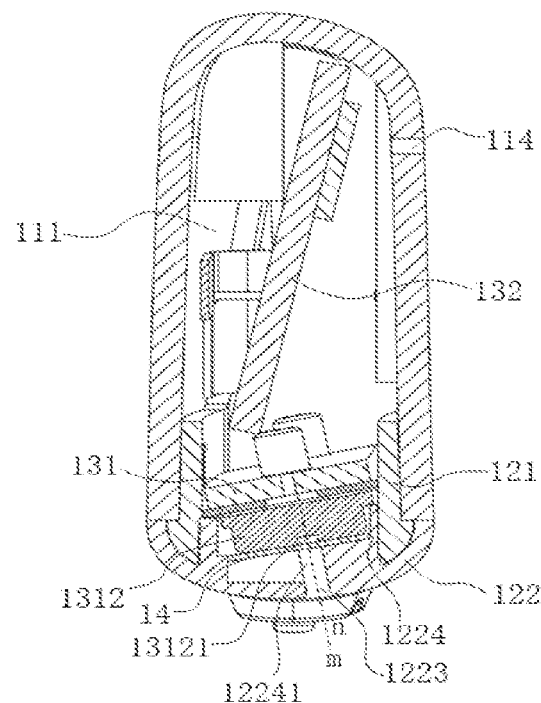
FIG. 17 is a schematic diagram illustrating a cross-section view of a loudspeaker device in an assembled state along a B-B axis in FIG. 11 of the present disclosure.
Figure 18:
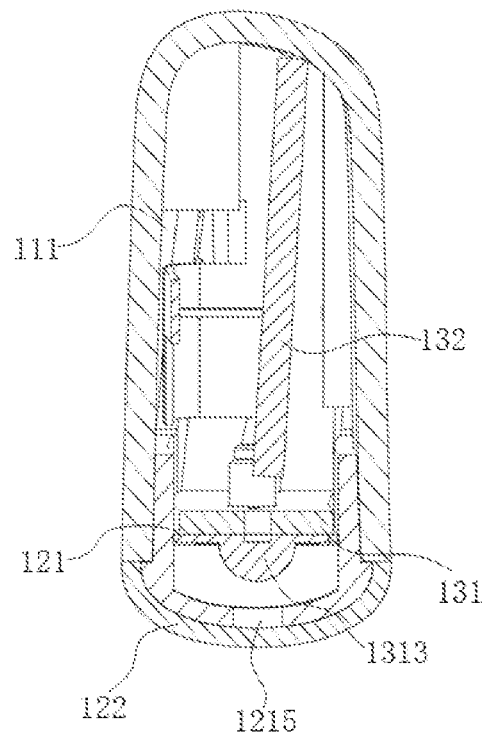
FIG. 18 is a schematic structural diagram illustrating an included angle, different from that in FIG. 17, between a first circuit board and a second circuit board according to some embodiments of the present disclosure.

FIG. 17 is a schematic diagram illustrating a cross-section view of a loudspeaker device in an assembled state along a B-B axis in FIG. 11 of the present disclosure. FIG. 18 is a schematic structural diagram illustrating an included angle, different from that in FIG. 17, between a first circuit board and a second circuit board according to some embodiments of the present disclosure. The first circuit board 131 may include the first microphone element 1312. In some embodiments, the first microphone element 1312 may be placed on one side of the first circuit board 131 facing the cover 12. For example, the first microphone element 1312 may be placed on the first circuit board 131 at intervals from the switch 1311 In some embodiments. The first microphone element 1312 may be used to receive a sound signal from the outside of the loudspeaker device, and convert the sound signal into an electrical signal for analysis and processing.

Correspondingly, the bracket 121 may be provided with a first microphone hole corresponding to the first microphone element 1312, and the soft cover layer 122 may be provided with a first sound guiding hole 1223 corresponding to the first microphone hole 1214. The first sound guiding hole 1223 may be arranged corresponding to the first microphone element 1312.

Specifically, the first sound guiding hole 1223 may be disposed on the cover 12, one end of the first sound guiding hole 1223 may be connected to the first microphone hole 1214 on the cover 12, and the other end of the first sound guiding hole 1223 may face to the first microphone element 1312, thereby shortening the sound guide distance and improving the sound guide effect.

Specifically, the first circuit board 131 may face the cover 12 in a manner parallel or inclined to the cover 12, and the first sound guiding hole 1223 may be perpendicular or inclined to the surface of the cover 12.

In some embodiments, the depth direction of the opening 112 may be vertical or inclined with respect to the bottom of the accommodating body 11. When the opening 112 is vertical, the cover 12 may be horizontal with respect to the accommodating body 11 after being covered. When the opening 112 is inclined, the cover 12 may be inclined relative to the accommodating body 11 after being covered, and the inclination may be inclined toward the side of the mouth of the human body. In this way, the first sound guiding hole 1223 may be more directly faced to the mouth or face of the human, thereby improving the effect of the microphone assembly for acquiring the sound of the main sound source.

Further, when the opening 112 is inclined, the included angle between the plane of the opening 112 and the plane of the width direction of the accommodating body may be in the range of 10° to 30°, so that the first sound guiding hole 1223 further faces the mouth area of the person. Specifically, when the opening 112 is inclined, the included angle between the plane of the opening 112 and the plane of the width direction of the accommodating body may be any angle within the above range, such as 10°, 15°, 20°, 23°, 27°, 30°, etc., which is not specifically limited here.

Specifically, the first sound guiding hole 1223 may penetrate the soft cover layer 122. When the opening 112 is vertical and the first circuit board 131 is parallel to the cover 12, the first sound guiding hole 1223 may be perpendicular to the cover 12, that is, the first sound guiding hole 1223 may be vertical. When the opening 112 is vertical and the first circuit board 131 is inclined to the cover 12, the first sound guiding hole 1223 may be inclined to the cover 12, that is, the first sound guiding hole 1223 may be inclined. When the opening 112 is inclined and the first circuit board 131 is parallel to the cover 12, the first sound guiding hole 1223 may be arranged perpendicular to the cover 12, that is, the first sound guiding hole 1223 may be inclined. When the opening 112 is inclined and the first circuit board 131 is inclined to the cover 12, the first sound guiding hole 1223 may also be arranged inclined to the cover 12. That is, the first sound guiding hole 1223 may be vertical or inclined.

Further, when the first circuit board 131 faces the cover 12 in a manner inclined to the cover 12, the included angle between the first circuit board 131 and the plane where the cover 12 may be located is in the range of 5°-20°. Specifically, when the first circuit board 131 faces the cover 12 in a manner inclined to the cover 12, the included angle between the first circuit board 131 and the plane where the cover 12 is located may be within the range of the above included angle, such as 5°, 8°, 10°, 15°, 20°, etc., which is not specifically limited here.

Specifically, the first sound guiding hole 1223 may correspond to the first microphone hole 1214 on the bracket 121, and the first microphone element 1312 may be communicated with the outside of the loudspeaker device, so that the sound outside the loudspeaker device may pass through the first sound guiding hole 1223 and the first microphone hole 1214, and is received by the first microphone element 1312.

In order to further improve the sound guide effect, the central axis of the first sound guiding hole 1223 may coincide with the main axis of the sound receiving region 13121 of the first microphone element 1312. The sound receiving region 13121 of the first microphone element 1312 refers to a region (for example, a diaphragm) on the first microphone element 1312 that receives sound waves. When the central axis of the first sound guiding hole 1223 coincides with the main axis of the sound receiving region 13121 of the first microphone element 1312, the sound of the main sound source may be collected by the first microphone hole 1214 and may be directly guided to the receiving region 13121 of the first microphone element 1312 through the first sound guiding hole 1223. Therefore, the sound propagation path may be further reduced, which may prevent the main sound source from being repeatedly propagated in the cavity to cause loss and echo, and may also prevent the main sound source from being transmitted to the area where the second microphone elements 1321 are located through the channel in the cavity, thereby improving the sound effect.

In an embodiment, the cover 12 may be arranged in a strip shape, wherein the main axis of the first sound guiding hole 1223 and the main axis of the sound receiving region 13121 of the first microphone element 1312 may coincide with each other in the width direction of the cover 12. The main axis of the sound receiving region 13121 of the first microphone element 1312 refers to the main axis of the sound receiving region 13121 of the first microphone element 1312 in the width direction of the cover 12, such as the axis n in FIG. 17. The main axis of the first sound guiding hole 1223 may be the axis m in FIG. 17, and the axis n and the axis m may coincide.

Further, the first sound guiding hole 1223 may be in any shape, as long as it can receive sound from the outside of the loudspeaker device. In some embodiments, the first sound guiding hole 1223 may be a circular hole with a relatively small size, and may be placed in a region of the cover 12 corresponding to the first microphone hole 1214. The small first sound guiding hole 1223 may reduce the communication between the first microphone element 1312 or the like in the loudspeaker device with the outside, thereby improving the sealing effect of the loudspeaker device.

Furthermore, in order to guide the sound signal entering through the first sound guiding hole 1223 to the first microphone element 1312, the sound guide channel 12241 may be set in a curved shape.

Specifically, in an application scenario, the main axis of the first sound guiding hole 1223 may be arranged in the middle of the cover 12 in the width direction of the cover 12.

At the same time, the hard bracket 121 may include a microphone hole 1214 corresponding to the first microphone element 1312. The soft cover layer 122 of the cover 12 may include a first sound blocking member 1224 at a position corresponding to the first sound guiding hole 1223. The first sound blocking member 1224 may extend inside the cavity 111 through the microphone hole 1214, limiting the transmission of sound to the transmission direction of the first microphone element 1313 and defining a sound guiding channel 12241. One end of the sound guiding channel 12241 may be in communication with the first sound guiding hole 1223 on the soft cover layer 122. The first microphone element 1312 may be inserted into the sound guiding channel 12241 from the other end of the sound guiding channel 12241.

The loudspeaker device may further include the switch 1311 described above. The switch hole 1213 and the first microphone hole 1214 may be placed on the hard bracket 121 at intervals.

Further, the distance between switch hole 1213 and the first microphone hole 1214 may be within a range of 10-20 mm, for example, 10 mm, 15 mm, 20 mm, etc.

Correspondingly, the first sound blocking member 1224 may extend from the soft cover layer 122, to a periphery of the first sound guiding hole 1223, through the microphone hole 1214, inside the cavity 111, to a periphery of the first microphone element 1312, to form a sound guiding channel 12241 from the first sound guiding hole 1223 to the first microphone element 1312. Thus, the sound signal of the loudspeaker device entering the sound guiding hole may directly reach the first microphone element 1312 through the sound guiding channel 12241.

Specifically, a shape of a cross section of the sound guiding channel 12241 perpendicular to a length direction thereof may be the same as or different from a shape of the microphone hole 1214 or the first microphone element 1312.

In an application scenario, shapes of cross sections of the first microphone hole 1214 and the first microphone element 1312 in a direction perpendicular to the hard bracket 121 facing toward the cavity 111 may be square. A size of the microphone hole 1214 may be slightly larger than an outside size of the sound guiding channel 12241. An inside size of the sound guiding channel 12241 may be not smaller than the outside size of the first microphone element 1312, such that the sound guiding channel 12241 may pass through the first sound guiding hole 1223 to reach the first microphone element 1312 and cover the periphery of the first microphone element 1312.

In this way, the soft cover layer 122 of the loudspeaker device may include a first sound guiding hole 1223 and a sound guiding channel 12241. The sound guiding channel 12241 may pass from the periphery of the first sound guiding hole 1223, through the microphone hole 1214 to reach the first microphone element 1312, and cover the periphery of the first microphone element 1312. The sound guiding channel 12241 may make the sound signal entering from the first sound guiding hole 1223 reach the first microphone element 1312 through the first sound guiding hole 1223, and may be received by the first microphone element 1312, which may reduce leakage of the sound signal in a propagation process, thereby improving the efficiency of receiving electronic signals of the loudspeaker device.

In an application scenario, the loudspeaker device may further include a waterproof mesh 14 placed in the sound guiding channel 12241. The waterproof mesh 14 may abut a side of the soft cover layer 122 facing toward the microphone element by the first microphone element 1312, and cover the first sound guiding hole 1223.

Specifically, the hard bracket 121 in the sound guiding channel 12241 close to the first microphone element 1312 may form a convex surface corresponding to the first microphone element 1312, such that the waterproof mesh 14 may be sandwiched between the first microphone element 1312 and the convex surface. The waterproof mesh 14 may also be directly bonded to a periphery of the first microphone element 1312, and the setting manner thereof is not limited here.

In addition to waterproofing the first microphone element 1312, the waterproof mesh 14 in this embodiment may also have effects such as sound transmission, so as to avoid affecting a sound receiving performance of a sound receiving region 13121 of the first microphone element 1312.

It should be noted that, due to a setting need for the circuit component 13, the first microphone element 1312 may be placed at a first position of the first circuit board 131. When the first sound guiding hole 1223 is disposed, the first sound guiding hole 1223 may be placed at a second position of the cover 12 due to requirements of beauty and convenience. In some embodiments, the first position and the second position may not correspond to each other along the width direction of the cover 12, such that the main axis of the first sound guiding hole 1223 and the main axis of the sound receiving region 13121 of the first microphone element 1312 may be spaced from each other in the width direction of the cover 12. Therefore, the sound entering from the first sound guiding hole 1223 may not be able to reach the sound receiving region 13121 of the first microphone element 1312 in a straight line.

In some embodiments, the cover 12 may be part of a housing of the loudspeaker device. In order to meet an overall aesthetic requirement of the loudspeaker device, the first sound guiding hole 1223 may be placed in the middle of the cover 12 in the width direction, such that the first sound guiding hole 1223 may look more symmetrical and meet visual needs of people.

In some embodiments, the corresponding sound guiding channel 12241 may be set to have a stepped shape along a cross-section along the B-B axis in FIG. 11, such that the sound signal introduced by the first sound guiding hole 1223 may be transmitted to the first microphone element 1312 through the sound guiding channel 12241 in the stepped shape and received by the first microphone element 1312.

Figure 19:
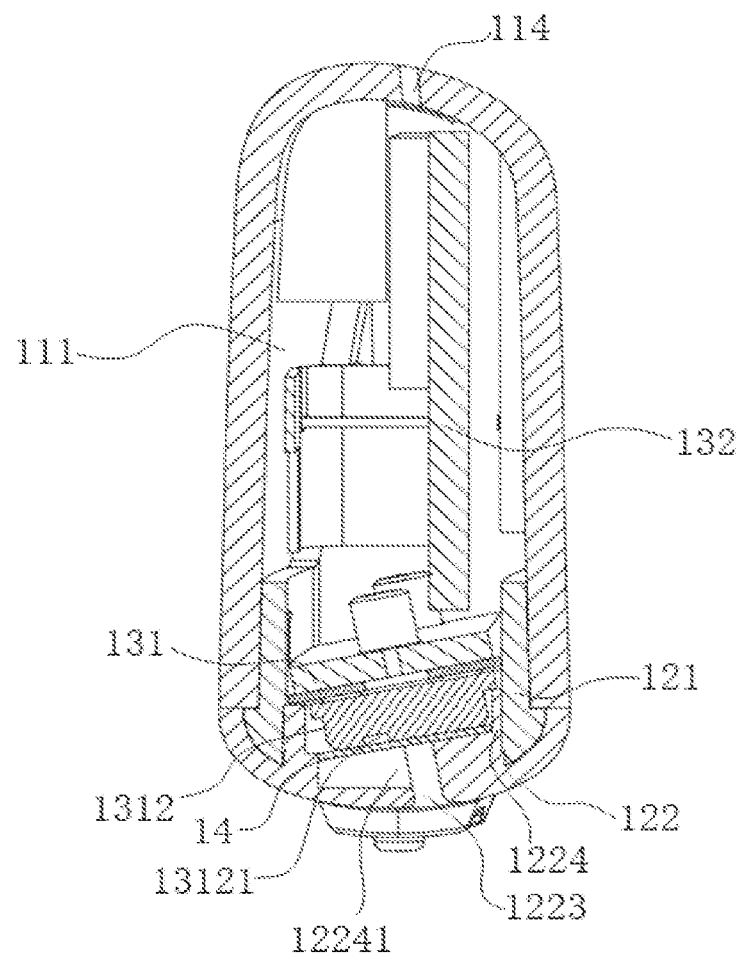
FIG. 19 is a schematic diagram illustrating a cross-section view of a loudspeaker device in an assembled state along a C-C axis in FIG. 11.

FIG. 19 is a schematic diagram illustrating a cross-section view of a loudspeaker device in an assembled state along a C-C axis in FIG. 11. In some embodiments, the loudspeaker device may further include a light emitting element 1313. The light emitting element 1313 may be placed on the first circuit board 131 of the circuit component 13 to be accommodated in the cavity 111. For example, the light emitting element 1313 may be placed on the first circuit board 131 in a certain arrangement together with the switch 1311 and the first microphone element 1312 In some embodiments. It should be noted that the circuit component 13 may be equivalent to the control circuit in the foregoing embodiments.

In some embodiments, the hard bracket 121 may include a light emitting hole 1215 corresponding to the light emitting element 1313. The soft cover layer 122 may cover the light emitting hole 1215, and a thickness of a region corresponding to the light emitting hole 1215 of the soft cover layer 122 may be set to allow light generated by the light emitting element 1313 to be transmitted through the soft cover layer 122.

The light emitting element 1313 may include a light emitting diode, etc. A count or number of the light emitting element 1313 may be one or more. A count or number of the light emitting holes 1215 on the hard bracket 121 may be the same as the count or number of the light emitting element 1313. When there are multiple light emitting element 1313, there may be different light emitting holes 1215 correspondingly, and different signals may be transmitted through different light emitting elements 1313.

In some embodiments, the soft cover layer 122 may still transmit the light emitted by the light emitting element 1313 to the outside of the loudspeaker device while covering the light emitting hole 1215 by certain means.

In some embodiments, a thickness of an entire region or part region of the soft cover layer 122 corresponding to the light emitting hole 1215 may be less than a thickness of a region of the soft cover layer 122 corresponding to a periphery of the light emitting hole 1215, such that the light emitted by the light emitting element 1313 may pass through the light emitting hole 1215 and may be transmitted through the soft cover layer 122. Of course, the region of the soft cover layer 122 covering the light emitting hole 1215 may transmit light through other means, which is not specifically limited here. For example, a window may be disposed on the soft cover layer 122 corresponding to the entire area or part of the light emitting hole 1215, and the window may be covered with a layer of transparent or light-transmitting material (for example, thin film, quartz, etc.), so that the light emitted by the light emitting element 1313 can pass through the light emitting hole 1215 and be further transmitted through the window.

In this way, the soft cover layer 122 may cover the light emitting hole 1215 of the corresponding light emitting element 1313, and may allow light emitted by the light emitting element 1313 to be transmitted from the soft cover layer 122 to the outside of the loudspeaker device. Thus, the light emitting element 1313 may be sealed by the soft cover layer 122 without affecting the light emitting function of the loudspeaker device, so as to improve the sealing effect and waterproof performance of the loudspeaker device.

In some embodiments, the hard bracket 121 may be further provided with a light blocking member 1216 extending toward the inside of the cavity 111 on the periphery of the light emitting hole 1215, and the light blocking member 1216 may limit the transmission direction of the light generated by the light emitting element 1313.

The shape of the light emitting hole 1215 may be any shape that may transmit the light emitted by the light emitting element 1313, such as a circle, a square, a triangle, etc. In some embodiments, the shape of the light emitting hole 1215 may be a circle.

Since there is still a certain distance between the light emitting element 1313 and the light emitting hole 1215, if there is no restriction, part of the light emitted by the light emitting element 1313 may be leaked out in the process of reaching the light emitting hole 1215, so that the light may not effectively propagate to the light emitting hole 1215, thereby reducing the brightness of the light that can be seen from the outside of the loudspeaker device, and making it inconvenient for the user to receive signals. However, the arrangement of the light blocking member 1216 in this embodiment may limit the transmission direction of the light generated by the light emitting element 1313, so as to reduce light leakage, thereby improving the brightness of the light transmitted through the light emitting hole 1215.

Specifically, the light blocking member 1216 in this embodiment may be partially or entirely formed by a hard bracket 121. For example, the hard bracket 121 may extend along the periphery of the light emitting hole 1215 toward the inside of the cavity 111 and surround the light emitting element 1313. Therefore, a light channel for light propagation may be formed, through which the light generated by the light emitting element 1313 can propagate directly to the light emitting hole 1215 along the arrangement direction of the channel, or the hard bracket 121 may not form a light channel, but only restrict the propagation of light from one direction or several directions. For example, the hard bracket 121 may extend from only one side of the light emitting hole 1215 into the cavity 111 to form a light blocking member 1216 that shields the light emitting element 1313. As another example, the light blocking member 1216 may further cooperate with other components to limit the spread of light. For example, the hard bracket 121 may extend from one side of the light emitting hole 1215 into the cavity 111 to form a light blocking member 1216 for blocking the light emitting element 1313. The light blocking member 1216 may further cooperate with the inner wall of the cavity 111 or other structures of the hard bracket 121 to restrict the transmission direction of the light generated by the light emitting element 1313 from multiple directions.

In an application scenario, the light emitting element 1313 and the first microphone element 1312 may be adjacently arranged on the first circuit board 131, and the corresponding light emitting holes 1215 and the first microphone holes 1214 may be arranged on the hard bracket 121 at intervals. As described above, a first sound blocking member 1224 formed by a soft cover layer 122 and defining a sound guide channel 12241 may be disposed on the periphery of the first microphone element 1312, and the first sound blocking member 1224 may be arranged to pass through the first microphone hole 1214, so that the first microphone element 1312 and the light emitting element 1313 are spaced apart, and the first microphone hole 1214 and the light emitting hole 1215 are spaced apart.

Specifically, in this application scenario, the light blocking member 1216 formed by the hard bracket 121 may cooperate with a side wall of the first sound blocking member 1224 close to the light emitting element 1313, limiting the transmission direction of the light generated by the light emitting element 1313.

In another application scenario, the cavity 111 may be arranged in a strip shape on a cross section perpendicular to the direction of the opening 112. Correspondingly, the hard bracket 121 may be also in a strip shape and inserted into the cavity 111 from the opening 112 through the insertion part 1211 to form a mechanical connection with the cavity 111. Insertion parts 1211 may be disposed on both sides along the length direction of the hard bracket 121, so that the light emitting element 1313 is also provided with corresponding insertion parts 1211 of the hard bracket 121 on both sides along the length direction of the hard bracket 121, so as to limit the light on both sides of the light emitting element 1313. Further, in this application scenario, the light blocking member 1216 may be further disposed on the side of the light emitting element 1313 perpendicular to the length direction of the hard bracket 121. The side wall of the first sound blocking member 1224 may be arranged on the other side of the light emitting element 1313 perpendicular to the length direction of the hard bracket 121. The light blocking member 1216 and the first sound blocking member 1224 may be parallel plates and further restrict the transmission direction of the light generated by the light emitting element 1313 together with the insertion parts 1211 on both sides of the light emitting element 1313.

In some embodiments, the circuit component 13 in the loudspeaker device may include the first circuit board 131 in the above embodiment of the loudspeaker device, and may further include a second circuit board 132. More descriptions thereof may be found in FIG. 11, FIG. 14, FIG. 17, and FIG. 18.

It should be noted that the second circuit board 132 may be equivalent to the second branch circuit board in the foregoing embodiment.

Specifically, the second circuit board 132 may be disposed facing the accommodating body 11, and the second circuit board 132 may be disposed in the cavity 111 so as to be sloped with respect to the first circuit board 131. One side of the second circuit board 132 facing the accommodating body 11 may be provided with a second microphone element 1321.

The second microphone element 1321 may be arranged to face the side wall of the accommodating body 11, so that there is a large space near the second microphone element 1321, and it is convenient to provide functional components corresponding to the second microphone element 1321 on the accommodating body 11. In addition, the second circuit board 132 may be arranged so as to be sloped with respect to the first circuit board 131, and the functional components on the two circuit boards may be arranged in a staggered manner, which may also reduce the distance between the functional components, thereby further saving and compressing the interior space of the loudspeaker device.

The side wall of the accommodating body 11 opposite to the cover 12 or the first sound guiding hole 1223 may be further provided with a second sound guiding hole 114.

A second sound guiding hole 114 may be correspondingly disposed on the side wall of the accommodating body 11. The second sound guiding hole 114 and the first sound guiding hole 1223 may be away from each other. In some embodiments, the opening 112 of the accommodating body 11 may be an inclined opening, the cover 12 may be inclined with respect to the accommodating body 11. The side wall of the accommodating body 11 opposite to the first sound guiding hole 1223 may be a side surface of the cavity 111. The second sound guiding hole 114 may be disposed on one side surface of the accommodating body 11. Furthermore, the second sound guiding hole 114 may be disposed on one side surface of the accommodating body 11 and may be within a range of 3-6 mm from the top of the accommodating body 11. Specifically, the distance may be 3 mm, 4 mm, 5 mm, 6 mm, etc.

In some embodiments, when the depth direction of the opening 112 of the accommodating body 11 is vertical with respect to the bottom of the accommodating body, the cover 12 may be arranged horizontally relative to the accommodating body 11. The side wall of the accommodating body 11 opposite to the first sound guiding hole 1223 may be the top of the cavity 111. The sound guiding hole 114 may be disposed on the top of the accommodating body 11. Further, the second sound guiding hole 114 may be disposed at the middle position of the top of the accommodating body 11.

The above method may keep the second sound guiding hole 114 away from the main sound source, and reduce the sound of the main sound source received by the second sound guiding hole 114, thereby increasing the proportion of the second sound guiding hole 114 receiving environmental noise, and enhancing the noise reduction effect.

As described in the above embodiment of the loudspeaker device of the present disclosure, the cover 12 may be provided with a first sound guiding hole 1223 corresponding to the first microphone element 1312 and the first microphone hole 1214, wherein the first microphone element 1312 may be used to receive the sound input from the first sound guiding hole 1223, and the second microphone element 1321 may be used to receive and the sound input from the second sound guiding hole 114.

Further, the central axis of the second sound guiding hole 114 may coincide with the main axis of the sound receiving region of the second microphone element 1321.

When the central axis of the second sound guiding hole 114 coincide with the main axis of the sound receiving region of the second microphone element 1321, noise may be directly guided to the sound receiving region of the second microphone element 1321 through the second sound guiding hole 114, thereby reducing the propagation of the noise inside the cavity 111. At the same time, the noise may be directly guided to the sound receiving region 13121 of the first microphone element 1312 through the first sound guiding hole 1223. The noises received by the first microphone element 1312 and the second microphone element 1321 may be approximately the same, which is beneficial for eliminating noise in subsequent processing and improving the quality of the main sound source.

In some embodiments, the central axis of the second sound guiding hole 114 may be coincident with or parallel to the central axis of the first sound guiding hole 1223.

The second sound guiding hole 114 and the first sound guiding hole 1223 may have the same central axis direction, that is, their central axes may coincide or be parallel. In addition, the sound entrance of the second sound guiding hole 114 and the sound entrance of the first sound guiding hole 1223 may face opposite directions, thereby reducing the main sound source received by the second sound guiding hole 114, which is beneficial for eliminating noise in subsequent processing and improving the quality of the main sound source.

In some embodiments, the main axis of the sound receiving region of the second microphone element 1321 may coincide with or be parallel to the main axis of the sound receiving region 13121 of the first microphone element 1312. The sound receiving region of the second microphone element 1321 may receive the sound signal passing through the second sound guiding hole 114, and the sound receiving region 13121 of the first microphone element 1312 may receive the sound signal passing through the first sound guiding hole 1223. Since the main sound source signal passing through the second sound guiding hole 114 is small, the main sound source signal received by the sound receiving region of the second microphone element 1321 may be small, which helps to achieve the effect of improving the quality of the audio signal.

In some embodiments, the first circuit board 131 may be arranged parallel to the opening plane of the opening 112 and close to the opening 112. Optionally, the first circuit board 131 may also be inclined to the opening plane of the opening 112 and disposed close to the opening 112. Furthermore, the switch 1311, the light emitting element 1313, etc., as described above may be further disposed on the first circuit board 131. The switch 1311, the light emitting element 1313, and the first microphone element 1312 may be arranged on the first circuit board 131 in a certain arrangement. Correspondingly, a switch hole 1213, a light emitting hole 1215, a first microphone hole 1214, etc., may be separately arranged on the cover 12 to transmit signals to the outside of the loudspeaker device through the corresponding holes.

Further, the first microphone hole 1214 may be arranged at the center of the cover 12. The switch hole 1213 and the light emitting hole 1215 may be respectively arranged on both sides of the first microphone hole 1214 in the length direction of the cover 12. The distance between the switch hole 1213 and the first microphone hole 1214, and the distance between the light emitting hole 1215 and the first microphone hole 1214 may be in the range of 5-10 mm, and specifically may be 5 mm, 6 mm, 7 mm, 8 mm, 9 mm, 10 mm, etc. The distance between the switch hole 1213 and the light emitting hole 1215 from the first microphone hole 1214 may be equal or unequal.

In some embodiments, the accommodating body 1151 may extend from the opening 112 in a direction perpendicular to the opening plane to form a cavity 111 with a certain width. The second circuit board 132 may be arranged to be parallel to the width direction of the cavity 111 and perpendicular to the opening plane. Optionally, the second circuit board 132 may also be inclined to the width direction of the cavity 111 and arranged inclined to the plane of the opening 112. The second circuit board 132 may be disposed in the cavity 111 so as to be sloped with respect to the first circuit board 131. The second circuit board 132 may be further provided with a main control chip, an antenna, etc.

In some embodiments, the second circuit board 132 may be inclined to the width direction of the cavity 111 and arranged to be inclined to the plane of the opening 112. The included angle between the second circuit board 132 and the width direction of the cavity 111 may be in the range of 5°-20°. Specifically, the included angle between the second circuit board 132 and the width direction of the cavity 111 may be any angle within the above range, for example, 5°, 10°, 15°, 20°, etc., which are not specifically limited here.

In an application scenario, when the user uses the loudspeaker device, the main axis of the sound receiving region of the second microphone element 1321 may coincide with the main axis of the sound receiving region 13121 of the first microphone element 1312, and the first microphone element 1312 and the second microphone element 1321 may be in a straight line with the user's mouth.

In some embodiments, the first microphone element 1312 and the second microphone element 1321 may be respectively disposed on two circuit boards. Two microphone elements may receive sound signals through the first sound guiding hole 1223 and the second sound guiding hole 114 respectively, one of which may be used to collect main sounds such as human voices, while the other microphone element may have a background noise collection function to facilitate the collection of ambient noise. The two microphone elements may cooperate to analyze and process the received sound signal, which may play a role in noise reduction, etc., thereby improving the quality of sound signal processing.

FIG. 18 is a schematic structural diagram illustrating an included angle, different from that in FIG. 17, between a first circuit board and a second circuit board. As shown in FIG. 17 and FIG. 18, the first circuit board 131 and the second circuit board 131 may be arranged so as to be sloped with respect to each other in the same cavity 111, which may make the installation mode of the two circuit boards more flexible. The angle between the two circuit boards may be adjusted according to the size and position of the electronic components on the two circuit boards, thereby improving the space utilization rate of the loudspeaker device. Further, when the two circuit boards are further used in the loudspeaker device, the space of the loudspeaker device may be saved, which facilitates the thinning of the loudspeaker device.

Further, the included angle between the first circuit board 131 and the second circuit board 132 may be in the range of 50° to 150°, and specifically, the angle between the first circuit board 131 and the second circuit board 132 may be any angle within the above range, such as 70°, 80°, 90°, 100°, 110°, etc.

Specifically, in an application scenario, the opening 112 and the cover 12 may be arranged in a corresponding elongated shape. The shape of the first circuit board 131 may match the shape of the opening 112, and the width dl of the first circuit board 131 may be not greater than the size of the plane of the opening along the width direction of the opening 112, so that the first circuit board 131 (parallel or inclined to the plane where the opening is located) may be accommodated in the cavity 111 near the opening 112. That is, the first circuit board 131 may be also arranged in a strip shape. Correspondingly, the switch 1311, the light emitting element 1313, and the first microphone element 1312 may be arranged on the first circuit board 131 at intervals along the length direction of the first circuit board 131, that is, the length direction of the cover 12.

In some embodiments, the second microphone element 1321 may be a bone conduction microphone, and the bone conduction microphone may extend out of the accommodating body 11 through the second sound guiding hole 114. The bone conduction microphone may be installed on a side wall of the housing body 11. The side wall may be a side wall that fits the user's body when the user wears the loudspeaker device, so that the bone conduction microphone may better receive the vibration signal of the main sound source. When the user wears the loudspeaker device for voice input, the second microphone element 1321 may mainly collect the vibration signal of the main sound source, and compare the vibration signal with the sound signal (including audio signal and noise) collected by the first microphone element 1312 (air conduction). In some embodiments, the sound signal collected by the first microphone element 1312 may be optimized based on the above comparison result to obtain a high-quality audio signal.

In some embodiments, the component body may be provided with a second sound guiding hole 114 passing through the side wall of the cavity 111, and a second sound blocking member 115 may be disposed at a position corresponding to the second sound guiding hole 114. The second sound blocking member 115 may extend toward the interior of the cavity 111 through the second sound guiding hole 114 to limit the transmission of sound to the second microphone element 1321.

In some embodiments, the second sound guiding hole 114 corresponding to the second microphone element 1321 may be disposed on the component body, and penetrate the cavity 111 to communicate the second microphone element 1321 with the outside, so that the second microphone element 1321 may receive external sound signals.

The second sound blocking member 115 may be a hard material or a soft material. For example, the second sound blocking member 115 may be formed by the accommodating body 11 extending from the inner side of the cavity 111 along the periphery of the second sound guiding hole 114 toward the cavity 111. In some embodiments, the second sound blocking member 114 may be formed by a soft rubber that is integrally injected with the accommodating body 11 and is formed by extending the inner side of the cavity 111 along the periphery of the second sound guiding hole 114 toward the cavity 111. In an application scenario, the second sound blocking member 115 may extend into the cavity 111 along the periphery of the second sound guiding hole 114 to the second microphone element 1321, and further surround the sound receiving region of the second microphone element 1321 to form a channel connecting the second sound guiding hole 114 and the second microphone element 1321, so that the external sound signal input to the second sound guiding hole 114 directly passes through the channel and is received by the sound receiving region of the second microphone element 1321. In another application scenario, the second sound blocking member 115 may not completely surround the periphery of the second sound guiding hole 114, but only extends along one or both sides of the second sound guiding hole 114 toward the inside of the cavity 111. The second sound blocking member 115 may extend to the second microphone element 1321 to guide the sound input from the second sound guiding hole 114 to propagate to the second microphone element 1321 and be received by its sound receiving region.

It should be noted that the above descriptions of the dual microphone assembly of the loudspeaker device is merely provided for the purposes of illustration, and should not be regarded as the only feasible implementation. Obviously, for those skilled in the art, after understanding the basic principle of the dual microphone assembly of the loudspeaker device, multiple modifications and variations to the specific means and steps of the dual microphone assembly of the loudspeaker device may be made without departing from this principle. However, these modifications and variations do not depart from the scope of the present disclosure. For example, the dual microphone assembly may further include an audio signal processing component. The audio signal processing component may compare a vibration signal of the main sound source collected by the second microphone element 1321 with a sound signal (including an audio signal and a noise) collected by the first microphone element 1312 (air conduction). The audio signal processing component may further optimize the sound signal collected by the first microphone element 1312 based on the above comparison result to obtain a high-quality audio signal. Such deformations are all within the protection scope of the present disclosure.

Figure 20:
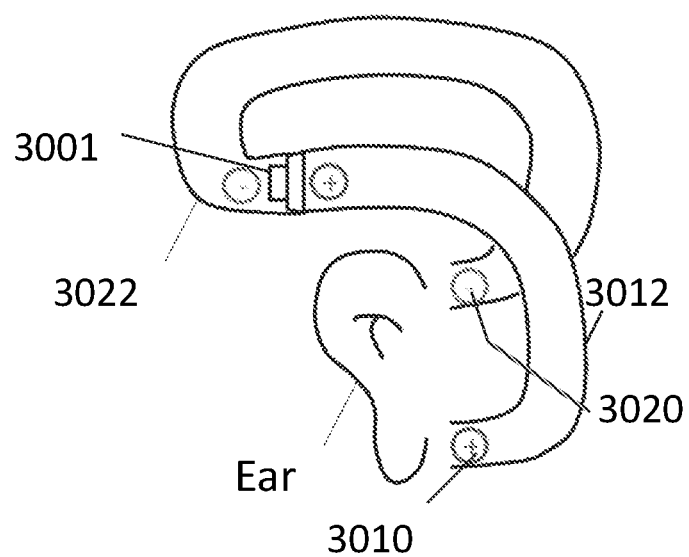
FIG. 20 is a schematic diagram illustrating transmitting a sound through air conduction according to some embodiments of the present disclosure.

In some embodiments, the loudspeaker device described above may also transmit the sound to the user through air conduction. When the air condition is used to transmit the sound, the loudspeaker device may include one or more sound sources. The sound source may be located at a specific position of the user's head, for example, the top of the head, a forehead, a cheek, a temple, an auricle, the back of an auricle, etc., without blocking or covering an ear canal. FIG. 20 is a schematic diagram illustrating transmitting a sound through air conduction according to some embodiments of the present disclosure.

As shown in FIG. 20, a sound source 3010 and a sound source 3020 may generate sound waves with opposite phases ("+" and "−" in the figure indicate the opposite phases). For brevity, the sound source mentioned herein may refer to sound outlets of the loudspeaker device that may output sounds. For example, the sound source 3010 and the sound source 3020 may be two sound outlets respectively located at specific positions of the loudspeaker device (for example, the core housing 41, or the circuit housing 10).

In some embodiments, the sound source 3010 and the sound source 3020 may be generated by the same vibration device 3001. The vibration device 3001 may include a diaphragm (not shown in the figure). When the diaphragm is driven to vibrate by an electric signal, the front side of the diaphragm may drive the air to vibrate, the sound source 3010 may be formed at the sound outlet through a sound guiding channel 3012, the back of the diaphragm may drive air to vibrate, and the sound source 3020 may be formed at the sound outlet through a sound guiding channel 3022. The sound guiding channel may refer to a sound transmission route from the diaphragm to the corresponding sound outlet. In some embodiments, the sound guiding channel may be a route surrounded by a specific structure on the loudspeaker device (for example, the core housing 41, or the circuit housing 10). It should be known that, in some alternative embodiments, the sound source 3010 and the sound source 3020 may also be generated by different vibrating diaphragms of different vibration devices, respectively.

Among the sounds generated by the sound source 3010 and the sound source 3020, one portion may be transmitted to the ear of the user to form the sound heard by the user. Another portion may be transmitted to the environment to form a leaked sound. Considering that the sound source 3010 and the sound source 3020 are relatively close to the ears of the user, for convenience of description, the sound transmitted to the ears of the user may be referred to as a near-field sound. The leaked sound transmitted to the environment may be referred to as a far-field sound. In some embodiments, the near-field/far-field sounds of different frequencies generated by the loudspeaker device may be related to a distance between the sound source 3010 and the sound source 3020. Generally speaking, the near-field sound generated by the loudspeaker device may increase as the distance between the two sound sources increases, while the generated far-field sound (the leaked sound) may increase with the increasing of the frequency.

For the sounds of different frequencies, the distance between the sound source 3010 and the sound source 3020 may be designed, respectively, so that a low-frequency near-field sound (e.g., a sound with a frequency of less than 800 Hz) generated by the loudspeaker device may be as large as possible and a high-frequency far-field sound (e.g., a sound with a frequency greater than 2000 Hz) may be as small as possible. In order to implement the above purpose, the loudspeaker device may include two or more sets of dual sound sources. Each set of the dual sound sources may include two sound sources similar to the sound source 3010 and the sound source 3020, and generate sounds with specific frequencies, respectively. Specifically, a first set of the dual sound sources may be used to generate low frequency sounds. A second set of the dual sound sources may be used to generate high frequency sounds. In order to obtain more low-frequency near-field sounds, the distance between two sound sources in the first set of the dual sound sources may be set to a larger value. Since the low-frequency signal has a longer wavelength, the larger distance between the two sound sources may not cause a large phase difference in the far-field, and not form excessive leaked sound in the far-field. In order to make the high-frequency far-field sound smaller, the distance between the two sound sources in the second set of the dual sound sources may be set to a smaller value. Since the high-frequency signal has a shorter wavelength, the smaller distance between the two sound sources may avoid the generation of the large phase difference in the far-field, and thus the generation of the excessive leaked sounds may be avoided. The distance between the second set of the dual sound sources may be less than the distance between the first set of the dual sound sources.

The beneficial effects of the embodiments of the present disclosure may include but be not limited to the following: (1) simplifying the wiring process inside the loudspeaker device; (2) improving the effect of the microphone assemblies to acquire sounds from the main sound source. It should be noted that different embodiments may have different beneficial effects. In different embodiments, the possible beneficial effects may be any one or a combination of the above, and may be any other beneficial effects that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "data block," "module," "engine," unit," "component," or "system." Furthermore, aspects of the present disclosure may take the form of a computer program product embodied in one or more computer-readable media having computer-readable program code embodied thereon.

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

What is claimed is:

1. A loudspeaker device, comprising:
   an earphone core configured to transfer an electrical signal to a vibration signal;
   an auxiliary function module configured to receive an auxiliary signal and perform an auxiliary function;
   a first flexible circuit board configured to electrically connect with an audio signal wire and an auxiliary signal wire of an external control circuit, the audio signal wire and the auxiliary signal wire being electrically connected to the earphone core and the auxiliary function module, respectively through the first flexible circuit board, wherein the first flexible circuit board includes a plurality of first pads and a plurality of second pads, at least one first pad of the plurality of first pads is electrically connected with the audio signal wire, the at least one first pad being connected with at least one second pad of the plurality of second pads via a first flexible lead on the first flexible circuit board, the at least one second pad being electrically connected with the earphone core via an external wire, at least one other first pad of the plurality of first pads is electrically connected with the auxiliary signal wire, and the at least one other first pad is electrically connected with the auxiliary function module via a second flexible lead on the first flexible circuit board;
   a core housing configured to accommodate the earphone core, the auxiliary function module, and the first flexible circuit board; and
   a fixing mechanism operably connected with the core housing and configured to support and maintain a position of the core housing, a battery assembly and a control circuit being disposed in the fixing mechanism, wherein the battery assembly includes
      a battery having a positive terminal and a negative terminal, and
      a second flexible circuit board including a first board and a second board perpendicularly connected with the first board, the first board being fixed on the battery, the second board being provided with a plurality of pads, wherein the plurality of pads include two third pads and a plurality of fourth pads, the two third pads are electrically connected with the positive terminal and the negative terminal of the battery through third flexible leads arranged on the first board and the second board, the plurality of fourth pads are divided into at least two groups, fourth pads in each group being electrically connected with each other through fourth flexible leads arranged on the first board, and the second flexible circuit board is electrically connected with the audio signal wire and the auxiliary signal wire of the core housing.

2. The loudspeaker device of claim 1, wherein:
   the first flexible circuit board includes a main circuit board and a first branch circuit board, the first branch circuit board being operably connected with the main circuit board and extending away from the main circuit board along one end of the main circuit board; and
   the auxiliary function module includes a first auxiliary function module and a second auxiliary function module, the first auxiliary function module being disposed on the main circuit board, the second auxiliary function module being disposed on the first branch circuit board.

3. The loudspeaker device of claim 2, wherein:
   the first flexible circuit board further includes a second branch circuit board, the second branch circuit board being operably connected with the main circuit board and extending away from the main circuit board along the other end of the main circuit board, the second branch circuit board being spaced apart from the first branch circuit board; and
   the auxiliary function module further includes a third auxiliary function module disposed on the second branch circuit board.

4. The loudspeaker device of claim 3, wherein
the core housing includes a peripheral side wall and a bottom end wall operably connected to an end surface of the peripheral side wall, the first branch circuit board being disposed facing the bottom end wall, the second branch circuit board being disposed facing the peripheral side wall;
the second auxiliary function module includes a first microphone element; and
the third auxiliary function module includes a second microphone element; wherein
the first microphone element is disposed on a side of the first branch circuit board facing the bottom end wall, and
the second microphone element is disposed on a side of the second branch circuit board facing the peripheral side wall.

5. The loudspeaker device of claim 4, wherein:
the core housing is provided with a first sound guiding hole on the bottom end wall opposite to the first microphone element, the first sound guiding hole being configured to guide sound to the first microphone element; and
the core housing is provided with a second sound guiding hole on the peripheral side wall opposite to the second microphone element, the second sound guiding hole being configured to guide sound to the second microphone element.

6. The loudspeaker device of claim 5, wherein a central axis of the first sound guiding hole coincides with a main axis of a sound receiving region of the first microphone element.

7. The loudspeaker device of claim 5, wherein a central axis of the second sound guiding hole coincides with a main axis of a sound receiving region of the second microphone element.

8. The loudspeaker device of claim 5, further comprising at least one of:
a first sound blocking member, wherein the bottom end wall is provided with the first sound blocking member at a position corresponding to the first sound guiding hole, the first sound blocking member extending toward an inside of the core housing through the first microphone hole to limit a transmission direction of a sound to the first microphone element; or
a second sound blocking member, wherein the peripheral side wall is provided with the second sound blocking member at a position corresponding to the second sound guiding hole, the second sound blocking member extending toward an inside of the core housing through the second sound guiding hole to limit a transmission direction of a sound to the second microphone element.

9. The loudspeaker device of claim 1, wherein the earphone core includes:
a magnetic circuit component configured to provide a magnetic field; and
a vibration component including a coil and an inner lead, wherein
the coil is located in the magnetic field,
the inner lead is electrically connected with the coil,
the coil is capable of receiving an audio current through the inner lead, and converting the audio current into a mechanical vibration signal under an action of the magnetic field, and
one end of the external wire is electrically connected with the plurality of second pads, and the other end of the external wire is electrically connected to the inner lead to transmit the audio current to the coil.

10. The loudspeaker device of claim 9, wherein the core housing includes a wiring groove, the at least one of the external wire or the inner lead being disposed in the wiring groove.

11. The loudspeaker device of claim 1, wherein the first board is folded so that the second board is attached to a side surface of the battery.

12. The loudspeaker device of claim 11, wherein the battery includes a battery cell including a body region and a sealing region, wherein
a thickness of the body region is greater than a thickness of the sealing region, so that a side surface of the sealing region and a side surface of the body region are arranged in a stepped manner, and
the second board is attached to the side surface of the sealing region.

13. The loudspeaker device of claim 12, wherein the battery further includes a hard circuit board disposed on the side surface of the sealing region, wherein
the positive terminal and the negative terminal are disposed on the hard circuit board,
the first board is attached and fixed on the hard circuit board, and
the hard circuit board is provided with a protection circuit.

14. The loudspeaker device of claim 1, wherein the fourth pads in each group are arranged at intervals along a width direction of the second board and are arranged staggered along a length direction of the second board.

15. The loudspeaker device of claim 1, wherein a count of the fourth pads in each group is two.

16. The loudspeaker device of claim 1, wherein the first board is connected with a middle region of the second board, so that the first board and the second board are set in a "T" shape.

17. The loudspeaker device of claim 16, wherein the two third pads are located in the middle region of the second board, and the plurality of fourth pads are distributed on sides of the two third pads.

18. The loudspeaker device of claim 1, wherein the auxiliary function module is configured to realize at least one of an image function, a voice function, an auxiliary control function, or a switch control function.

19. The loudspeaker device of claim 2, wherein
the plurality of first pads are disposed on the main circuit board, and
the at least one second pad is disposed on the first branch circuit board.

20. The loudspeaker device of claim 3, wherein
the plurality of first pads are disposed on the main circuit board,
the at least one second pad of the plurality of second pads is disposed on the first branch circuit board, and
other second pads of the plurality of second pads are disposed on the second branch circuit board.

* * * * *